United States Patent [19]
Wang et al.

[11] Patent Number: 5,871,811
[45] Date of Patent: *Feb. 16, 1999

[54] METHOD FOR PROTECTING AGAINST DEPOSITION ON A SELECTED REGION OF A SUBSTRATE

[75] Inventors: David Nin-Kou Wang, Cupertino; John M. White, Hayward; Kam S. Law; Cissy Leung, both of Union City; Salvador P. Umotoy, Pittsburg; Kenneth S. Collins, San Jose; John A. Adamik, San Ramon; Ilya Perlov, Mountain View; Dan Maydan, Los Altos Hills, all of Calif.

[73] Assignee: Applied Materials, Inc., Santa Clara, Calif.

[ * ] Notice: The term of this patent shall not extend beyond the expiration date of Pat. No. 4,872,947.

[21] Appl. No.: 477,536

[22] Filed: Jun. 7, 1995

Related U.S. Application Data

[63] Continuation of Ser. No. 928,642, Aug. 13, 1992, which is a continuation of Ser. No. 537,445, Jun. 13, 1990, abandoned, which is a continuation of Ser. No. 944,492, Dec. 19, 1986, Pat. No. 5,000,113.

[51] Int. Cl.$^6$ .................................................. C23C 16/00
[52] U.S. Cl. .................. 427/248.1; 427/255; 427/255.1; 427/255.2; 427/255.3; 427/314
[58] Field of Search .............................. 427/248.1, 255.3, 427/255.2, 314, 255.1, 255, 579; 118/715, 725

[56] References Cited

U.S. PATENT DOCUMENTS

| | | | |
|---|---|---|---|
| 3,200,019 | 8/1965 | Scott et al. | 148/188 |
| 3,330,694 | 7/1967 | Black et al. | 117/201 |
| 3,627,590 | 12/1971 | Mammel | 148/1.5 |
| 3,661,637 | 5/1972 | Sirtl | 117/201 |

(List continued on next page.)

FOREIGN PATENT DOCUMENTS

| | | | |
|---|---|---|---|
| 0157052 | 12/1984 | European Pat. Off. | H01L 23/52 |
| 0159621 | 4/1985 | European Pat. Off. | G03F 7/26 |
| 0204182 | 5/1986 | European Pat. Off. | H01L 21/316 |
| 1490476 | 6/1967 | France . | |

(List continued on next page.)

OTHER PUBLICATIONS

M. King et al., "Experiments on Gas Cooling of Wafers", *Nuclear Instruments and Methods*, pp. 169–173, (1981).

E. Bogle–Rohwer et al., "Wall Profile Control in a Triode Etcher", *Solid State Technology*, pp. 251–255, (Apr. 1985).

W.N. Hammer, "Cooling Ion–Implantation Target", *IBM Technical Disclosure Bulletin*, vol. 19, No. 6, pp. 2270–2271, (Nov. 1976).

F.T. Turner et al., "Advances in Cassette–to–Cassette Sputtercoating Systems*", *Solid State Technology*, pp. 155–123, (Jul. 1993).

(List continued on next page.)

*Primary Examiner*—Roy V. King
*Attorney, Agent, or Firm*—Townsend and Townsend and Crew

[57] ABSTRACT

A method for protecting a selected area of a substrate against deposition on the selected area. The method includes the steps of flowing a process gas into a substrate processing chamber and flowing a purge gas to the selected area of the substrate to prevent the process gas from contacting the selected area or minimize contact between the process gas and the selected area. In various embodiments the selected area is a backside periphery of the substrate or the edge of the substrate. Also in these embodiments, the process gas is flowed into a deposition zone in order to deposit a thin film layer over an upper surface of the substrate, and a flow of the process and purge gas is established such that the process gas flows radically across the upper surface of the substrate, combines with the purge gas near an edge of the substrate and exits the processing chamber through an exhaust system.

45 Claims, 6 Drawing Sheets

U.S. PATENT DOCUMENTS

| | | | |
|---|---|---|---|
| 3,721,210 | 3/1973 | Helms et al. | 118/48 |
| 3,791,342 | 2/1974 | Boyer et al. | 118/52 |
| 3,854,443 | 12/1974 | Baerg | 118/49 |
| 3,934,060 | 1/1976 | Burt et al. | 427/95 |
| 3,955,163 | 5/1976 | Novak | 355/132 |
| 4,002,512 | 1/1977 | Lim | 148/187 |
| 4,261,762 | 4/1981 | King | 148/1.5 |
| 4,282,268 | 8/1981 | Priestly et al. | 427/39 |
| 4,313,783 | 2/1982 | Davies et al. | 156/643 |
| 4,457,359 | 7/1984 | Holden | 165/80 |
| 4,466,872 | 8/1984 | Einbinder | 204/192 R |
| 4,492,716 | 1/1985 | Yamazaki | 427/38 |
| 4,496,609 | 1/1985 | McNeilly et al. | 427/55 |
| 4,503,807 | 3/1985 | Nakayama et al. | 118/719 |
| 4,508,161 | 4/1985 | Holden | 165/1 |
| 4,512,391 | 4/1985 | Harra | 165/48 R |
| 4,527,620 | 7/1985 | Pederson et al. | 165/80 D |
| 4,535,228 | 8/1985 | Mimura et al. | 219/411 |
| 4,550,684 | 11/1985 | Mahawili | 118/724 |
| 4,563,240 | 1/1986 | Shibata et al. | 156/643 |
| 4,565,601 | 1/1986 | Kakehi et al. | 156/643 |
| 4,567,938 | 2/1986 | Turner | 165/1 |
| 4,575,408 | 3/1986 | Bok | 204/192 E |
| 4,576,698 | 3/1986 | Gallagher et al. | 204/192 E |
| 4,603,466 | 8/1986 | Morley | 29/569 R |
| 4,615,755 | 10/1986 | Tracy et al. | 156/345 |
| 4,625,678 | 12/1986 | Shioya et al. | 118/723 |
| 4,640,221 | 2/1987 | Barbee et al. | 118/689 |
| 4,640,224 | 2/1987 | Bunch et al. | 118/725 |
| 4,647,266 | 3/1987 | Turner et al. | 414/225 |
| 4,671,204 | 6/1987 | Ballou | 118/59 |
| 4,680,061 | 7/1987 | Lamont, Jr. | 148/1.5 |
| 4,687,682 | 8/1987 | Koze | 437/238 |
| 4,693,211 | 9/1987 | Ogami et al. | 118/725 |
| 4,695,700 | 9/1987 | Provence et al. | 219/121 PD |
| 4,702,936 | 10/1987 | Maeda et al. | 427/54.1 |
| 4,709,655 | 12/1987 | Van Mastrigt | 118/719 |
| 4,717,596 | 1/1988 | Barbee et al. | 427/248.1 |
| 4,724,621 | 2/1988 | Hobson et al. | 34/218 |
| 4,731,255 | 3/1988 | Maeda et al. | 427/54.1 |
| 4,738,748 | 4/1988 | Kisa | 156/643 |
| 4,745,088 | 5/1988 | Inoue et al. | 437/102 |
| 4,747,368 | 5/1988 | Brien et al. | 118/715 |
| 4,767,641 | 8/1988 | Kieser et al. | 427/38 |
| 4,768,464 | 9/1988 | Hayashi et al. | 118/722 |
| 4,790,262 | 12/1988 | Nakayama et al. | 118/52 |
| 4,791,398 | 12/1988 | Sittler et al. | 338/25 |
| 4,845,054 | 7/1989 | Mitchener | 437/238 |
| 4,857,142 | 8/1989 | Syverson | 156/646 |
| 4,859,625 | 8/1989 | Matsumoto | 437/81 |
| 4,872,947 | 10/1989 | Wang et al. | 156/643 |
| 4,892,753 | 1/1990 | Wang et al. | 427/38 |
| 4,990,374 | 2/1991 | Keeley et al. | 427/255.1 |
| 5,000,113 | 3/1991 | Wang et al. | 118/723 |
| 5,028,566 | 7/1991 | Lagendijk | 437/238 |
| 5,094,885 | 3/1992 | Selbrede | 427/248.1 |
| 5,124,014 | 6/1992 | Foo et al. | 427/579 |
| 5,133,284 | 7/1992 | Thomas et al. | 118/719 |
| 5,230,741 | 7/1993 | van de Ven et al. | 118/728 |
| 5,238,499 | 8/1993 | van de Ven et al. | 118/724 |
| 5,354,715 | 10/1994 | Wang et al. | 437/238 |
| 5,362,526 | 11/1994 | Wang et al. | 427/573 |
| 5,374,594 | 12/1994 | van de Ven et al. | 437/247 |
| 5,447,570 | 9/1995 | Schmitz et al. | 118/728 |
| 5,535,834 | 7/1996 | Turner | 165/80 R |
| 5,542,298 | 8/1996 | Holden | 250/443.1 |

FOREIGN PATENT DOCUMENTS

| | | | |
|---|---|---|---|
| 2465791 | 9/1980 | France | C23C 5/00 |
| 2559953 | 2/1985 | France | H01L 21/68 |
| 0125968 | 11/1909 | Germany | 4/18 |
| 51-60454 | 5/1976 | Japan | H01L 21/314 |
| 60-24012 | 2/1985 | Japan | H01L 21/265 |
| 60-136314 | 7/1985 | Japan | . |
| 61-292913 | 12/1986 | Japan | H01L 21/22 |
| 1151746 | 5/1969 | United Kingdom | C01B 33/12 |
| 1174755 | 12/1969 | United Kingdom | C01B 33/12 |
| 2181458 | 4/1987 | United Kingdom | C23C 16/44 |
| 2181460 | 4/1987 | United Kingdom | C23C 16/44 |
| WO82/01482 | 5/1982 | WIPO | B05D 1/00 |
| WO 86/00938 | 2/1986 | WIPO | C23C 16/48 |
| WO 87/07310 | 12/1987 | WIPO | C23C 16/00 |

OTHER PUBLICATIONS

V. Hoffman et al., "Individual Water Metallization Utilizing Load–Locked, Close–Coupled Conical Magnetron Sputtering", *Solid State Technology*, pp. 105–111, (Feb. 1981).

P.S. Burggraaf, "Plasma Deposition Product Trends", *Semiconductor International*, pp. 23–32, (Mar. 1980).

E. Tanikawa et al., "Chemical Vapor Deposition in an Evacuated System", *Chemical Vapor Deoposition* (Wakefield and Blocher eds), pp. 261–275, (1973).

R.A. Connell et al., "Magnetically Shaped R.F. Discharge for Polymer Film Formation", *J. Electrochem. Soc.*, vol. 112, pp. 1198–1200, (1965).

"Part 2b–Deposited Dielectrics for VLSI", *Semiconductor International*, Werner Kern, RCA Laboratories, David Sarnoff Research Center, Princeton, NJ, pp. 122–129, (Jul., 1985).

A.C. Adams, "Dielectric and Polysilicon Film Deposition", *VLSI Technology* (McGraw Hill New York), pp. 93–129, (1983).

D.N.K. Wang et al., "Advanced CVD Technology", *Proc. 1st International Symposium ULSI Science and Technology*, pp. 712–723, (1987).

A.C. Adams, "Plasma–Assisted Deposition of Dielectric Films", *Proceedings of the Symposium of on Reduced Temperature Processing for VLSI* (eds Reig and Srinivasas), pp. 111–131, (1986).

Jiang Ruolian et al., "Plasma–Enhanced CVD $SiO_2$ Films on InP and Study of C–V Characteristics in InP–MIS Structures", *Chinese Journal of Semiconductors*, vol. 6, No. 4, pp. 429–432 (1985).

K.P. Pande et al., A Novel Low–Temperature Method of $SiO_2$ Film Deposition for MOSFET Applications, *J. Electronic Materials*, vol. 13, No. 3, pp. 593–602 (1984).

U. Mackens et al., "Plasma–Enhanced Chemically Vapour–Deposited Silicon Dioxide for Metal/Oxide/Semiconductor Structures on InSb", *Thin Solid Films*, vol. 97, pp. 53–61, (1982).

J. Woodward et al., "The Deposition of Insulators Onto InP Using Plasma–Enhanced Chemical Vapour Deposition*", *Thin Solid Films*, vol. 85, pp. 61–69, (1981).

E.B. Priestley et al., "Deposition and Characterization of Thin $SiO_2$ Films", *Thin Solid Films*, vol. 69, pp. 39–52, (1980).

P. Mazerolles et al., "Formation of Amorphous Semiconductors by Chemical Vapour Deposition From Organogermanium Compounds*", *Silicon, Germanium, Tin and Lead Compounds*, pp. 155–183, (ed. Gielen 1986).

A.K. Sinha, "Plasma Enhanced Chemical Vapor Deposition–A Review", *Electrochem. Soc. Ext.*, Abstract No. 242, pp. 625–627, (1976).

H.F. Sterling et al., "Chemical Vapour Deposition Promoted by r.f. Discharge", *Solid–State Electronics*, vol. 8, pp. 653–654, (1965).

L. L. Alt. et al., "Low–Temperature Deposition of Silicon Oxide Films", *J. Electrochem. Soc.,* vol. 110, p. 465, (1963).

K.M. Eisele, "Etching of $SiO_2$ In a Narowly Confined Plasma of High Power Density", *J. Vac. Sci Technol. B4(5),* pp. 1227–1232, (Sep./Oct. 1986).

G.S. Oehrlein, "Investigation of Reactive–Ion–Etching–Related Fluorocarbon Film Deposition Onto Silicon and a New Method for Surface Residue Removal", *J. Electrochem. Soc.: Solid–State Science and Technology,* pp. 1002–1008, (May 1986).

*Chemical Abstracts,* vol. 101, No. 20, p. 292, (Nov. 1984).

T. Fujino et al., "Preparation and Application of Organosilicon Compounds for CVD Process", *Oyo Buturi,* vol. 53, No. 11, pp. 956–961, (Nov. 1984).

D.J. DiMaria et al., "Use of Composite Silicon–Rich $SiO_2$ and $SiO_2$ Layers of Off–Stoichio–Metric CVD $SiO_2$ Layers for Improvement of Poly 1 to Poly 2 Dielectric", *IBM Technical Disclosure Bulletin,* vol. 25, No. 12, p. 6417, (May 1983).

J.S. Basi et al., "Plasma–Oxide–Filled Deep Dielectric Isolation", *IBM Technical Disclosure Bulletin,* vol. 25, No. 8, pp. 4405–4406, (Jan. 1983).

J.P. Gerault et al., "Elaboration et Caracterisation de Couches Minces de Carbure de Silicium Amorphe non Stoechiometrique: Comparison de Properietes des Materiaux Prepares Par CVD et Plasma Froid", *Ann. Chim. Fr.,* vol. 8, pp. 163–174, (1983).

J.P. Gerault et al., "X–ray Photoelectron Spectroscopy and Raman Spectroscopy Investigations of Amorphous $Si_xC_{1-x}$ (H) Coatings Obtained by Chemical Vapour Deposition From Thermally Labile Organosilicon Compounds", *Thin Solid Films,* vol. 101, pp. 83–96, (1983).

G. Constant et al., "Some Properties of Amorphous $Si_xC_{1-x}$ (H) Alloys Prepared By CVD From Various Organosilicon Compounds", *Solid State Chemistry,* pp. 267–270, (1982).

J.P. Gerault et al., "Amorphous Si(C) Deposits Prepared by Chemical Vapor Deposition at Low Temperature From Various Organometallic Compounds", *Proc. 8th International Conference, Chemical Vapor Deposition Elec. Soc. 1981, Electrochem. Soc.,* pp. 338–346, (1981).

B.M. Kemlage, "Elimination of Chlorine in LPCVD–$SiO_2$", *IBM Technical Disclosure Bulletin,* vol. 23, No. 5, p. 1879, (Oct. 1980).

T. Mohr, "Making Tunnel–Barrier Layers By Plasma Deposition", *IBM Technical Disclosure Bulletin,* vol. 22, No. 3, p. 1194, (Aug. 1979).

Tanikawa et al., "Doped Oxide Films by Chemical Vapor Deposition in an Evacuated System", *Denki Kagaku,* vol. 41, No. 7, pp. 491–497, (1971).

R. Kalnina et al., "Some Property Changes of Pyrolytic $SiO_2$ Films After Thermal Treatment", *Acedemy of Sciences of the Latvian SSR, Physical & Technical Science Series No. 13,* pp. 12–18, (1968).

S. Krongelb et al., "Low Temperature Environmental Effects on Pyrolytic $SiO_2$", *ECS Ext.Abstr.,* vol. 3, abstract No. 54, pp. 108–109, (1966).

J. Klerer, "On the Mechanism of the Deposition of Silica by Pyrolytic Decompositions of Silanes", *Electrochem. Soc.,* vol. 112, No. 5, pp. 503–506, (1965).

H. Binder et al., "Doping of Trench Capacitors for 4 Megabit DRAMs", *Ex. Abs. of the 18th (1986 International) Conference on Solid State Devices and Materials,* pp. 299–302, (1986).

"Dry Oxygen Tetraethyl Ortho Silicate Ameal", *IBM Technical Disclosure Bulletin,* vol. 27, No. 12, p. 7252, (May 1985).

K. Yamada et al., "A Deep–Trenched Capacitor Technology for 4 Mega Bit Dynamic Ram", *IEDM Tech. Dig.,* pp. 702–705, (1985).

F.S. Becker et al., "A New LPCVD Borophosphosilicate Glass Process Based on the Doped Deposition of TEOS–Oxide", *ECS Ext. Abstr.,* vol. 85–2, pp. 380–381, (1985).

Vogel et al., "Electrical Properties of Silicon Dioxide Films Fabricated at 700°C. I: Pyrolysis of Tetraehthoxysilane", *Journal of Electronic Materials,* vol. 14, No. 3, pp. 329–342, (1985).

S. Mori et al., "Reliable CVD Inter–Poly Dielectrics for Advanced E&Eeprom", *IEEE Cat. No. 85 CH 2125(31 ), 1985 Symposium on VLSI Technology,* pp. 16–17, (May 1985).

Basi et al., "Carbon–Free $SiO_2$ Films", *IBM Technical Disclosure Bulletin,* vol. 26, No. 4, pp. 1980–1982, (Sep. 1983).

R.H. Vogel et al., "Electrical Properties of 200–500Å LPCVD $SiO_2$ Films", *ECS Ext. Abstr.,* vol. 82–2, pp. 305–306, (1982).

A.C. Adams et al., "The Deposition of Silicon Dioxide Films at Reduced Pressure", *J. Electrochem. Soc.,* vol. 126, No. 6, pp. 1042–1046, (1979).

K. Maeda et al., "Very Low Temperature Chemical Vapor Deposition of Silicon Dioxide Films Using Ozone and Organosilane", *Denki Kagaku,* vol. 45, No. 10, pp. 654–659, (1977).

V.D. Wohlheiter et al., "High Production System for the Deposition of Silicon Dioxide", *ECS Ext. Abstr.,* vol. 75–1, pp. 424–425, (1975).

Y. Tsunoda, "Effect of Atmosphere on Arsenic Diffusion in Silicon", *Japaness J. Appl. Phys.,* vol. 12, No. 11, pp. 1901–1902, (1974).

E. Arai et al., "Structural Changes of Arsenic Silicate Glasses with Heat Treatments", *Japanese Journal of Applied Physics,* vol. 9, pp. 691–704, (Jun. 1970).

J.A. Aboaf, "Stresses in $SiO_2$ Films Obtained from the Thermal Decomposition of Tetrathylorthosilicate–Effect of Heat–Treatment and Humidity", *Electrochem. Soc.,* vol. 116, pp. 1732–1736, (1969).

G.W. Heunisch, "An Analysis of the Thermal Decomposition of Tetrathoxysilane By Gas Chromatography", *Analytica Chimica Acta,* vol. 48, No. 2, pp. 405–409, (1969).

Y. Nakai, "Low Temperature Deposition of Silica Films", *ECS Ext. Abstr.,* Abstract No. 84, vol. 5, No. 1, pp. 215–218, (1968).

D.B. Lee, "Diffusion Into Silicon From An Arsenic–Doped Oxide", *Solid–State Electronics,* vol. 10, pp. 623–624, (1967).

J. Klerer, "A Method for the Deposition of $SiO_2$ at Low Temperature", *Journal of the Electrochemical Society,* vol. 108, No. 11, pp. 1070–1071, (Nov. 1961).

K.P. Pande et al., "Plasma Enhanced Metal–Organic Chemical Vapor Deposition of Aluminum Oxide Dielectric Film For Device Applications", *J. Appl. Phys.,* vol. 54(9), pp. 5436–5440, (Sep. 1983).

A.D. Weiss, "Plasma Enhanced CVD: Silicon Nitride & Beyond", *Semiconductor International,* pp. 88–94, (Jul. 1983).

"AMP3300–Perforated Electrode", *Applied Materials CVD Marketing Report,* pp. 1–4, (Jan. 1983).

E.J. Egerton et al., "Positive Wafer Temperature Control to Increase Dry Etch Throughput and Yield", *Solid State Technology*, pp. 84–87, (Aug. 1982).

S.M. Sze, "Dielectric and Polysilicon Film Deposition", *VLSI Technology* (McGraw–Hill Book Company), pp. 94–108 and 116, (1983).

"Plasma Etching Process of Semiconductor Structures to Expose Metal", *IBM Technical Disclosure Bulletin*, vol. 28, No. 9, p. 3921, (Feb. 1986).

F.S. Becker et al., "A New LPCVD Borophosphosilicate Glass Process Based on the Doped Deposition of TEOS–Oxide", *Proceedings of the Symposium on Reduced Temperature Processing for VLSI* (eds. Reif and Srinivasas), pp. 148–159, (1986).

F.S. Becker et al., "Process and Film Characterization of Low Pressure Tetraethylorthosilicate–borophosphosilicate Glass", *J. Vac. Sci. Technol. B4(3)*, pp. 732–744, (May/Jun. 1986).

V.G. Minkina, "Pyrolytic Deposition of $SiO_2$ Films in a Reactor of the Flow Type in Steady–State Operation", *USSR J. Appl. Chem.*, vol. 58, No. 5, pp. 1053–1055, (1985).

U. Jönsson et al., "Chemical Vapour Deposition of Silanes*", *Thin Solid Films*, vol. 124, pp. 117–123, (1985).

R.H. Vogel et al., "Electrical Properties of 10–50 nm TEOS LPCVD Films", *Technical Report U.S. Army Research Office Contract DAAG29–14 81–K–0007*, pp. 1–29 (1984).

R.M. Levin et al., "Low Pressure Deposition of Phosphosilicate Glass Films", *J. Electrochem. Soc.*, vol. 129, No. 7, pp. 1588–1592, (1982).

P.C. Li et al., "CVD Hydrophobic Lead Silicate Films", *J. Electrochem. Soc.*, vol. 129, No. 1, pp. 165–172, (1982).

J. Oroshnik et al., "Pyrolytic Deposition of Silicon Dioxide in an Evacuated System", *J. Electrochem. Soc.*, vol. 115, No. 6 pp. 649–652, (1968).

E.L. Jordan, "A Diffusion Mask for Germanium", *J. Electrochem. Soc.*, vol. 108, No. 5, pp. 478–481, (1961).

J.P. Gerault, "Mass Spectrometric Investigation of the Thermal Decomposition of Various Organosilicon Compounds in $Si_xC_{1-x}$(H) Chemical Vapour Depositions", *Anal. Appl. Pyrolysis*, vol. 4, pp. 59–72, (1982).

N.V. Kukushkin et al., "Change in the Elastically Stressed State Of $Si–SiO_2$ Structures Under the Action of a Pulsed Magnetic Field", *Sov. Phys. Tech. Phys.*, vol. 30(10), pp. 1227–1228, (Oct. 1985).

D.C. Cameron et al., "MISFET and MIS Diode Behaviour of Some Insulator–InP Systems", *Insulating Films on Semiconductors, Springer, Berlin*, pp. 281–284, (1981).

A.J. Grant et al., "A Study of Deposited Dielectrics and the Observation of N–channel MOSFET Action in InP", *Inst. Phys. Conf. Ser. No. 50:*, Chapter 4, pp. 266–270, (1979).

M.J. Rand, "Plasma–promoted Deposition of Thin Inorganic Films", *J. Vac. Sci. Technol.*, pp. 420–427, (Mar./Apr. 1979).

K.I. Kirov et al., "Investigation of $SiO_2$ Layers Deposited by Plasma Decomposition of Tetra–Ethoxy Silane in a Planar Reactor", *Phys. Stat. Sol. (a)*, vol. 48, pp. 609–614, (1978).

J.A. Amick et al., "Deposition Techniques for Dielectric Films on Semiconductor Devices", *J. Vac. Sci. Technol.*, vol. 14, No. 5, pp. 1053–1063, (1977).

N. Kotera, "Magnetoconductance Oscillations of n–Type Inversion Layers in InSb Surfaces", *Physical Review B*, vol. 5, No. 8, pp. 3065–3078, (Apr. 1972).

S.P. Mukherjee et al., "The Deposition of Thin Films by the Decomposition of Tetra–Ethoxy Silane in a Radio Frequency Glow Discharge", *Thin Solid Films*, vol. 14, pp. 105–118, (May 1972).

I. Feltinsh et al., "Investigation of Mos–Structures With RF Glow Discharge Deposited $SiO_2$ Films", *Izv. Akad. Navk. LatvSSR Ser. Fiz. tekh. Navk.*, No. 2, pp. 48–52, (1970).

D.R. Secrist et al., "Incorporation of Water Into Vapour Deposited Oxide Films", *Solid–State Electronics*, vol. 9, pp. 180–182, (1966).

D.R. Secrist et al., "Deposition of Silica Films by the Glow Discharge Technique", *Journal of the Electrochemical Society*, vol. 113, pp. 914–920, (Sep. 1966).

S.W. Ing et al., "Glow Discharge Formation of Silicon Oxide and the Deposition oft Silicon Oxide Film Capacitors By Glow Discharge Techniques", *Journal of the Electrochemical Society*, vol. 112, pp. 284–288, (Mar. 1965).

S.W. Ing et al., "Use of Low–Temperature Deposited Silicon Dioxide Films As Diffusion Masks in GaAs", *Journal of the Electrochemical Society*, vol. 111, No. 1, pp. 120–122, (Jan. 1964).

R.A. Levy et al., "A New LPCVD Technique of Producing Borophosphosilicate Glass Films by Injection of Miscible Liquid Precursors", *J. Electrochem. Soc.*, vol. 134, No. 2, pp. 430–437, (Feb. 1987).

G.M. Tseitlin et al., "On Changing Mechanical Stress in Chemical Vapour Deposited $SiO_2$ By Ion Bombardment and Heat Treatment", *Nuclear Instruments in Methods for Physics Research*, vol. 19–20, pp. 931–933, (1987).

V.S. Nguyen et al., "Plasma Organosilicon Polymers, Deposition, Characterization, and Application in Multilayer Resist", *Journal of the Electrochemical Society*, vol. 132, No. 8, pp. 1925–1932, (Aug. 1985).

V.S. Nguyen et al., "Plasma Deposited Organosilicon Polymers–Deposition, Characterization, and Application in Multi–Layer Resist", *Proceedings of the Fifth Symposium on Plasma Processing*, pp. 299–316, (ed. Mathad, Schwartz and Smolinsky), (1985).

V.S. Nguyen et al., "Plasma–Deposited Organosilicon Polymers–Deposition, Characterization, and Application", *ECS Ext. Abstr.*, vol. 84–2, pp. 535–536, (1984).

A.K. Sinha, "Plasma Deposited Polycrytstalline Silicon Films", *Solid State Technology*, pp. 133–136, (Apr. 1980).

M. Vandenberg et al., "Cracking of Plasma Deposited Si–N Films After Subsequent Anneal", *Electrochem. So. Ext. Abstr.*, vol. 79(1), pp. 234–235, (1979).

A. Virtamins et al., "Low Temperature BT Treatment of Plasma–Grown $SiO_2$ Films", *Izv. Akad. Navk. LatvSSR Ser. fiz tekh. Nauk*, No. 1, pp. 32–35, (1977).

S. Krongelb, "Environmental Effects on Chemically Vapor–Plated Silicon Dioxide", *Electrochemical Technology*, vol. 6, No. 7–8, pp. 251–256, (Jul.–Aug. 1968).

Shanfield et al., "Process Characterization of PSG and BPSG Plasma Deposition", *Journal of Electrochemical Society*, vol. 131, No. 9, pp. 2202–2203, (Sep. 1984).

G. Smolinsky et al., "Measurements of Temperature Dependent Stress of Silicon Oxide Films Prepared by a Variety of CVD Methods", *J. Electrochem. Soc.*, vol. 132, No. 4, pp. 950–954, (Apr. 1985).

Y. Tsunoda, "Effect of Heating Rate on Film Roughering in As–Doped Oxide", *Japanese J. Appl. Phys.*, vol. 24, No. 3, pp. 365–366, (1985).

S.P. Murarka, "Phosphorus Out–Duffusion During High Temperature Anneal of Phosphorus–Doped Polycrystalline Silicon and $SiO_2$", *J. Appl. Phys.*, vol. 56, No. 8, pp. 2225–2230, (Oct. 1984).

R.M. Levin et al., "The Step Coverage of Undoped and Phosphorous–doped $SiO_2$ Glass Films", *J. Vac. Sci. Technol. B1(1)*, pp. 54–61, (Jan.–Mar. 1983).

S.H. Song et al., "Observation of the Anomalous Concentration Profiles of Antimony Atoms Diffused into Silicon Due to Local Precipitation", *J. Electrochem. Soc.,* vol. 129, No. 4, p. 841–846, (Apr. 1982).

R.M. Levin, "Water Absorption and Densification of Phospholicate Glass Films", *J. Electrochem. Soc.,* vol. 129, No. 8, pp. 1765–1770, (Aug. 1982).

A. Ya. Balagurov et al., "Comparison of Refractive Indices and IR Spectra of Silicon Dioxide Films Produced By Different Methods", *Sov. J. Opt. Technol. 46*(2), pp. 100–101, (Feb. 1979).

Huppertz et al., "Modeling of Low–Pressure Deposition of $SiO_2$ By Decomposition of TEOS", *IEEE Transactions on Electron Devices,* vol. ED–26, No. 4, p. 658–662, (1979).

Y. Tsuonda, "Considerations on the Stress Effects in the As–Doped Oxide Film Roughening", *Japanese J. Appl. Phys.,* No. 17, No. 12, pp. 2085–2089, (Dec. 1978).

W.A. Pliskin, "Comparison of Properties of Dielectric Films By Various Methods", *J. Vac. Sci. Technol.,* vol. 14, No. 5, pp. 1064–1081, (Sep./Oct. 1977).

Y. Tsunoda, "Effect of Stress on Film Roughening in As–Dopped Oxide", *Japanese J. Appl. Physl.,* vol. 16, No. 10, pp. 1869–1870, (1977).

E.B. Gorokhov et al., "Preparation of Uniform $SiO_2$ Films By Pyrolysis of Tetrathoxysilane", *Izvestiva Akademii Nauk SSSR, Neogranicheskie Mat.,* vol. 12, No. 2, pp.232–234, (1976).

K. Sugawara et al., "Formation of PSG Film Using Organic Compounds and its Applications to Silicon Device Fabrication", *Chemical Vapor Deposition,* ed. Blocher, J.M., Hinterman, H.E. and Hall, L.H., Electroch. soc., Princeton, NJ., pp. 407–421.

G. Hoffmann, et al., "Investigation of the Diffusion Parameters of the Borosilicate–Silicon System By Infrared Absorption", *J. Phys. D. Appl. Phys.,* vol. 8, pp. 1044–1052, (1975).

Arai et al., "Water Adsorption on Chemically Vapor–Deposited Glass Films", *Japan J. Appl. Phys. Suppl. 2,* Pt. 1, pp. 757–760, (1974).

P.C. Parekh et al., "The Influence of the Reaction Kinetics of $O_2$ and Source Flow Rates on the Uniformity of Boron and Arsenic Diffusions", *Solid–State Electronics,* vol. 14, pp. 281–288, (1971).

R.P. Kalnina et al., "Carrier Gas Influence on the Properties of $SiO_2$ Pyrolytic Films", *Izv. Akad. Nauk Latv SSR Ser. fiz. tekh. Nauk.,* No. 2, pp. 121–123, (1968).

W.A. Pliskin et al., "Structural Evaluation of Silicon Oxide Films", *Journal of the Electrochemical Society,* vol. 112, No. 10, pp. 1013–1019, (Oct. 1965).

J. Scott et al., "A Solid–to–Solid Diffusion Technique", *RCA Rev. 26,* pp. 357–368, (1965).

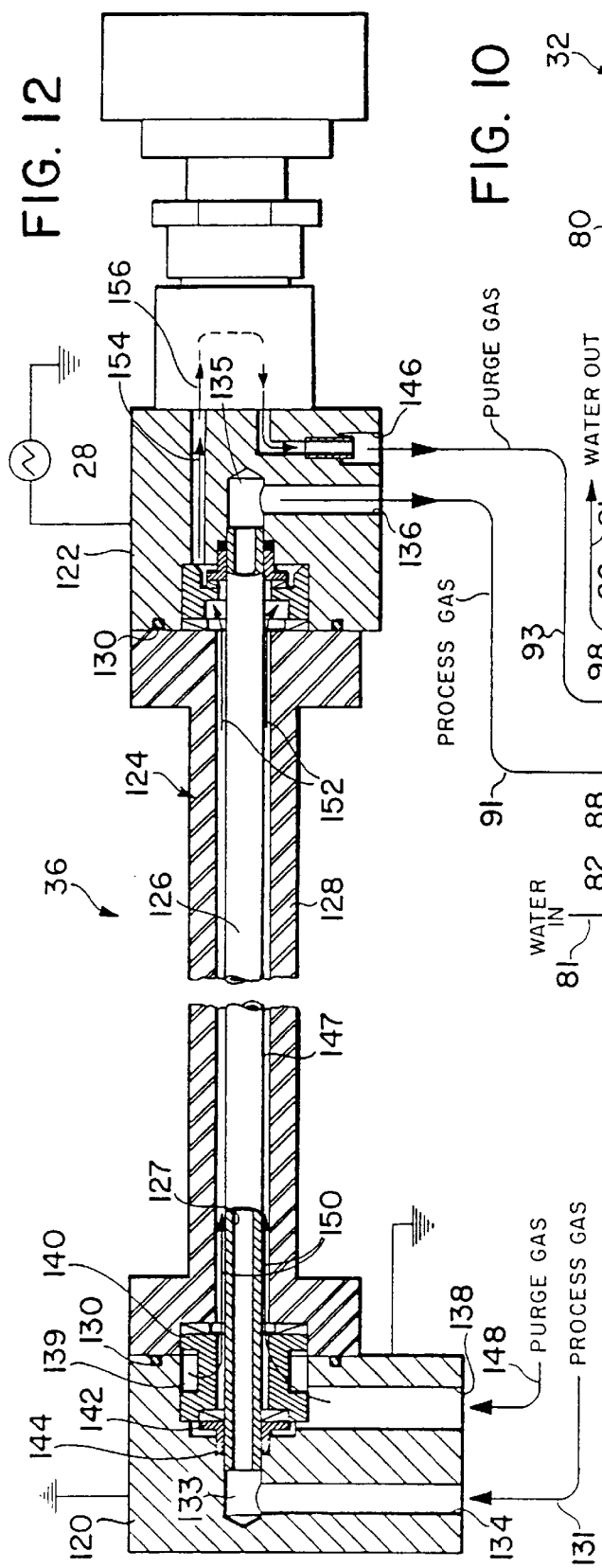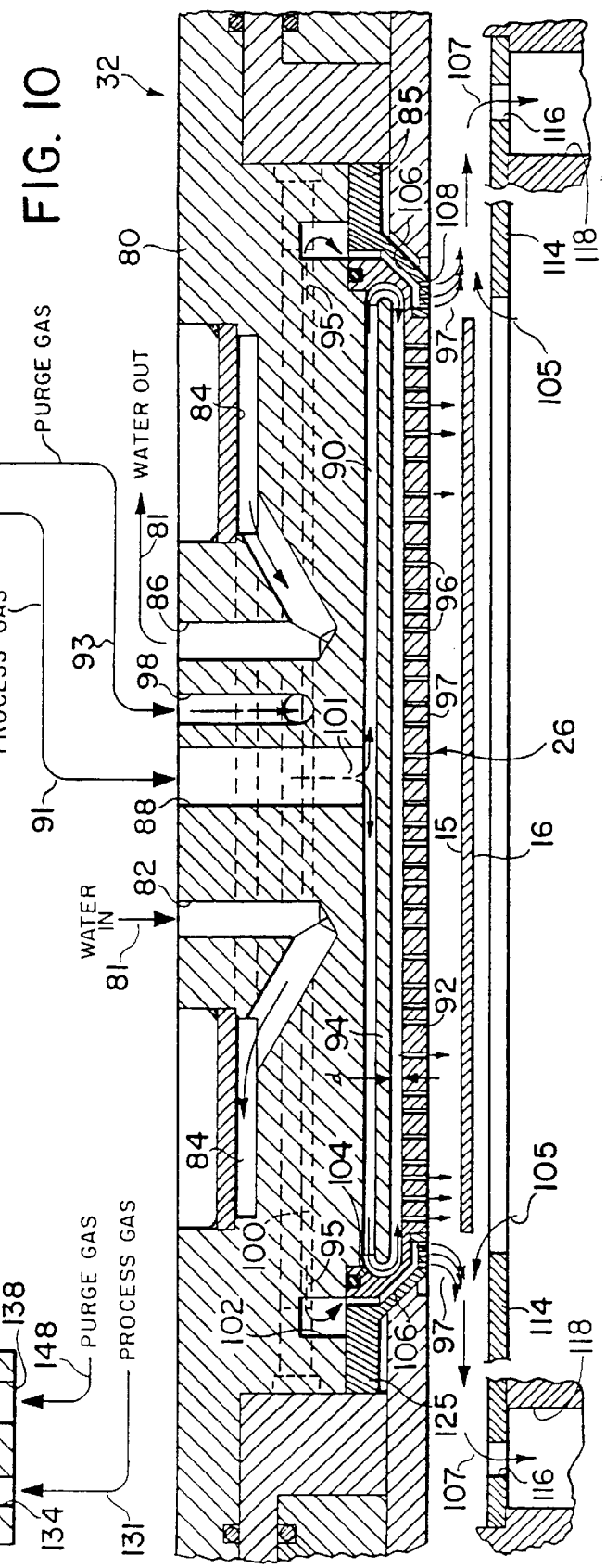

METHOD FOR PROTECTING AGAINST DEPOSITION ON A SELECTED REGION OF A SUBSTRATE

This application is a continuation of U.S. Ser. No. 07/928,642, filed Aug. 13, 1992; which is a continuation of U.S. Ser. No. 07/537,445, filed Jun. 13, 1990, now abandoned; which is a continuation of U.S. Ser. No. 06/944,492, filed Dec. 19, 1986, now U.S. Pat. No. 5,000,113.

BACKGROUND OF THE INVENTION

The present invention relates to a reactor and methods for performing single and in-situ multiple integrated circuit processing steps, including thermal CVD, plasma-enhanced chemical vapor deposition (PECVD), reactor self-cleaning, film etchback, and modification of profile or other film property by sputtering. The present invention also relates to a process for forming conformal, planar dielectric layers on integrated circuit wafers and to an in-situ multi-step process for forming conformal, planar dielectric layers that are suitable for use as interlevel dielectrics for multi-layer metallization interconnects.

I. Reactor

The early gas chemistry deposition reactors that were applied to semiconductor integrated circuit fabrication used relatively high temperature, thermally-activated chemistry to deposit from a gas onto a heated substrate. Such chemical vapor deposition of a solid onto a surface involves a heterogeneous surface reaction of gaseous species that adsorb onto the surface. The rate of film growth and the film quality depend on the wafer surface temperature and on the gaseous species available.

More recently, low temperature plasma-enhanced deposition and etching techniques have been developed for forming diverse materials, including metals such as aluminum and tungsten, dielectric films such as silicon nitride and silicon dioxide, and semiconductor films such as silicon.

The plasma used in the available plasma-enhanced chemical vapor deposition processes is a low pressure reactant gas discharge which is developed in an RF field. The plasma is, by definition, an electrically neutral ionized gas in which there are equal number densities of electrons and ions. At the relatively low pressures used in PECVD, the discharge is in the "glow" region and the electron energies can be quite high relative to heavy particle energies. The very high electron temperatures increase the density of disassociated species within the plasma which are available for deposition on nearby surfaces (such as substrates). The enhanced supply of reactive free radicals in the PECVD processes makes possible the deposition of dense, good quality films at lower temperatures and at faster deposition rates (300–400 Angstroms per minute) than are typically possible using purely thermally-activated CVD processes (100–200 Angstroms per minute). However, the deposition rates available using conventional plasma-enhanced processes are still relatively low.

Presently, batch-type reactors are used in most commercial PECVD applications. The batch reactors process a relatively large number of wafers at once and, thus, provide relatively high throughput despite the low deposition rates. However, single-wafer reactors have certain advantages, such as the lack of within-batch uniformity problems, which make such reactors attractive, particularly for large, expensive wafers such as 5–8 inch diameter wafers. In addition, and quite obviously, increasing the deposition rate and throughput of such single wafer reactors would further increase their range of useful applications.

II. Thermal CVD of $SiO_2$; Planarization Process

Recently, integrated circuit (IC) technology has advanced from large scale integration (LSI) to very large scale integration (VLSI) and is projected to grow to ultra-large integration (ULSI) over the next several years. This advancement in monolithic circuit integration has been made possible by improvements in the manufacturing equipment as well as in the materials and methods used in processing semiconductor wafers into IC chips. However, the incorporation into IC chips of, first, increasingly complex devices and circuits and, second, greater device densities and smaller minimum feature sizes and smaller separations, imposes increasingly stringent requirements on the basic integrated circuit fabrication steps of masking, film formation, doping and etching.

As an example of the increasing complexity, it is projected that, shortly, typical MOS (metal oxide semiconductor) memory circuits will contain two levels of metal interconnect layers, while MOS logic circuits may well use two to three metal interconnect layers and bipolar digital circuits may require three to four such layers. The increasing complexity, thickness/depth and small size of such multiple interconnect levels make it increasingly difficult to fabricate the required conformal, planar interlevel dielectric layers materials such as silicon dioxide that support and electrically isolate such metal interconnect layers.

The difficulty in forming planarized conformal coatings on small stepped surface topographies is illustrated in FIG. 16. There, a first film such as a conductor layer 171 has been formed over the existing stepped topography of a partially completed integrated circuit (not shown) and is undergoing the deposition of an interlayer dielectric layer 172 such as silicon dioxide. This is done preparatory to the formation of a second level conductor layer (not shown). Typically, where the mean-free path of the depositing active species is long compared to the step dimensions and where there is no rapid surface migration, the deposition rates at the bottom 173, the sides 174 and the top 175 of the stepped topography are proportional to the associated arrival angles. The bottom and side arrival angles are a function of and are limited by the depth and small width of the trench. Thus, for very narrow and/or deep geometries the thickness of the bottom layer 173 tends to be deposited to a lesser thickness than is the side layer 174 which, in turn, is less than the thickness of top layer 175.

Increasing the pressure used in the deposition process typically will increase the collision rate of the active species and decrease the mean-free path. This would increase the arrival angles and, thus, increase the deposition rate at the sidewalls 714 and bottom 173 of the trench or step. However, and referring to FIG. 17A, this also increases the arrival angle and associated deposition rate at stepped corners 176. For steps separated by a wide trench, the resulting inwardly sloping film configuration forms cusps 177—177 at the sidewall-bottom interface. It is difficult to form conformal metal and/or dielectric layers over such topographies. As a consequence, it is necessary to separately planarize the topography.

In addition, and referring to FIG. 17B, where the steps are separated by a narrow trench, for example, in dense 256 kilobit VLSI structures, the increased deposition rate at the corner 176 encloses a void 178. Such voids are exposed by subsequent planarization procedures and may allow the second level conductor to penetrate and run along the void and short the conductors and devices along the void.

SUMMARY OF THE INVENTION

Objects

In view of the above discussion, it is one object to provide a semiconductor processing reactor which provides uniform deposition over a wide range of pressures, including very high pressures.

It is another related object to provide a versatile single wafer semiconductor processing reactor which can be used for a multiplicity of processes including thermal chemical vapor deposition, plasma-enhanced chemical vapor deposition, plasma-assisted etchback, plasma self-cleaning and sputter topography modification, either alone or in-situ in a multiple process sequence.

It is a related object to provide such a reactor which accomplishes the above objectives and also is adapted for using unstable gases such as TEOS and ozone.

It is another object of the present invention to provide a process for forming highly conformal silicon dioxide layers, even over small dimension stepped topographies in VLSI and ULSI devices, using ozone and TEOS gas chemistry and thermal CVD.

It is also an object of the present invention to provide a planarization process which provides excellent conformal coverage and eliminates cusps and voids.

It is still another object of the present invention to provide a planarization process which can be performed in-situ using a multiple number of steps, in the same plasma reactor chamber, by simply changing the associated reactant gas chemistry and operation conditions.

It is yet another object of the present invention to provide an in-situ multiple step process including plasma deposition and isotropic etching of a wafer for the purpose of optimizing coating conformality and planarization, along with process throughput and wafer characteristics such as low particulates.

Another object is to provide the above-described versatile process characteristics along with the ability to vary the process sequence and the number of steps, including but not limited to the addition of reactor self-cleaning.

SUMMARY

In one specific aspect, our invention relates to a semiconductor processing reactor defining a chamber for mounting a wafer therein and an inlet gas manifold for supplying reactant gases to the wafer. The chamber also incorporates a uniform radial pumping system which includes vacuum exhaust pump means; a gas distributor plate mounted peripherally about the wafer mounting position within the chamber and including a circular array of exhaust holes therein; and a circular channel beneath and communicating with the hole array and having at least a single point connection to the vacuum exhaust pump for flowing gases radially from the inlet manifold across the wafer and through the exhaust port. The channel is of sufficiently large volume and conductance relative to the holes to enable controlled uniform radial gas flow across the wafer to the exhaust holes, thereby promoting uniform flow and processing (etching and deposition) over a wide range of pressures, including very high pressures up to about one atmosphere.

In another aspect, the present invention is directed to a semiconductor processing reactor which comprises a housing forming a chamber for mounting a wafer horizontally, a vacuum exhaust pumping system communicating with the chamber, and an inlet gas manifold oriented horizontally over the wafer mounting position. The manifold has a central array of process gas apertures configured for dispensing reactant gas uniformly over the wafer and a second peripheral array of purging gas apertures configured for directing purging gas downward to the periphery of the wafer. The hole arrays are also arranged to eliminate radial alignment of holes.

In another aspect, the reactor incorporates a system for circulating fluid of controlled temperature within the manifold for maintaining the internal surfaces within a selected temperature range to prevent condensation and reactions within the manifold and for maintaining the external manifold surfaces above a selected temperature range for eliminating unwanted deposition thereon.

In still another aspect, the reactor of the present invention comprises a thin susceptor for supporting a wafer, susceptor support means for mounting the susceptor in a horizontal position precisely parallel to the gas inlet manifold and means for selectively moving the wafer support means vertically to position the susceptor and support parallel to the gas manifold at selected variable-distance positions closely adjacent the gas manifold. In particular, the variable parallel close spacing can be 0.5 centimeter and smaller.

In still another aspect, the semiconductor processing reactor of the present invention comprises a housing defining a chamber therein adapted for the gas chemistry processing of a wafer positioned within the chamber. A transparent window forms the bottom of the chamber. A thin high emissivity susceptor is used for supporting a wafer within the chamber. A radiant heating module comprising a circular array of lamps mounted in a reflector module is mounted outside the housing for directing a substantially collimated beam of near-infrared radiant energy through the window onto the susceptor with an incident power density substantially higher at the edge of the susceptor than at the center thereof, to heat the wafer uniformly.

Preferably, a second, purge gas manifold is positioned beneath the wafer processing area for providing purging gas flow across the window and upward and across the bottom of the wafer. The combination of the high pressure, the purge flow from the inlet gas manifold and that from the purge gas manifold substantially eliminates deposition on chamber surfaces.

In still another aspect, the reactor of the present invention comprises a deposition gas feed-through device connected to the gas inlet manifold which comprises tube means adapted for providing co-axial flow of deposition gas on the inside of the tube and purge gas on the outside thereof into the gas inlet manifold. The tube is adapted for connection to ground at the inlet end and to an RF power supply at the outlet or manifold end to provide RF power to the manifold, and has a controlled electrical impedance along its length from the inlet to the outlet end for establishing a constant voltage gradient to prevent breakdown of the gas even at high RF frequencies and voltages.

These and other features discussed below permit reactor operation over a wide pressure regime, that is, over a wide of pressures including high pressures up to approximately one atmosphere. The features also provide uniform susceptor and wafer temperatures, including both absolute temperature uniformity and spatial uniformity across the susceptor/wafer; uniform gas flow distribution across the wafer; and effective purging. The variable parallel close spacing between the electrodes adapts the reactor to various processes. These features and the temperature control of the internal and external gas manifold temperatures enable the advantageous use of very sensitive unstable gases such as ozone and TEOS in processes such as the following.

That is, the present invention also relates to a method for depositing a conformal layer of silicon dioxide onto a substrate by exposing the substrate to a reactive species formed from ozone, oxygen, tetraethylorthosilicate, and a carrier gas within a vacuum chamber, using a total gas pressure within the chamber 10 torr to 200 torr and a substrate temperature within the range of about 200° C. to 500° C. Preferably, a substrate temperature of about 375° C. ±20° C. is used to obtain maximum deposition rates and the chamber pressure is about 40 torr to 120 torr.

In still another aspect, the present invention is embodied in a method for depositing silicon dioxide onto a film or substrate by exposing the substrate to the plasma formed from tetraethylorthosilicate, oxygen and a carrier gas in a chamber using a total gas pressure within the range of about 1 to 50 torr, and a substrate temperature in the range of about 200° C. to 500° C. Preferably, the chamber pressure is 8–12 torr and the substrate temperature is about 375° C. ±20° C.

In still another aspect, the invention is directed to a method for isotropically etching a silicon dioxide surface comprising the step of exposing a silicon dioxide surface to a plasma formed from fluorinate gas such as $NF_3$, $CF_4$ and $C_2F_6$ in a carrier gas in a chamber using a wafer temperature in the range of from about 200° C. to 500° C. Preferably, the chamber pressure is within the range of about 200 mT to 20 torr, and 500 mT to 10 torr.

The invention is also embodied in a method for planarizing a non-planar dielectric coating or composite within a vacuum chamber by depositing a conformal layer of silicon dioxide onto the coating by exposing the coating to a reactive species formed from ozone, oxygen, tetraethylorthosilicate and a carrier gas, the total chamber gas pressure being within the approximate range 10 torr to 200 torr and the substrate temperature being within the approximate range 200° C. to 500° C., to thereby form a composite of the conformal layer on the substrate; and isotropically etching the outer surface of the resulting composite layer. Preferably, this planarizing process uses the plasma oxide deposition to first form a layer of silicon oxide and also uses the isotropic etch described above.

BRIEF DESCRIPTION OF THE DRAWINGS

The above and other aspects and advantages of the present invention are described in conjunction with the following drawing figures, in which:

FIG. 10 is an enlarged, partial depiction of FIG. 2 showing the process gas and purge gas distribution systems in greater detail;

FIG. 12 depicts an enlarged, vertical cross-section of the RF/gas feed-through system shown in FIG. 2;

FIGS. 13A–13C schematically depict various alternative embodiments of the gas feed-through;

DETAILED DESCRIPTION OF THE INVENTION

I. CVD/PECVD Reactor

A. Overview of CVD/PECVD Reactor

Figure 1:
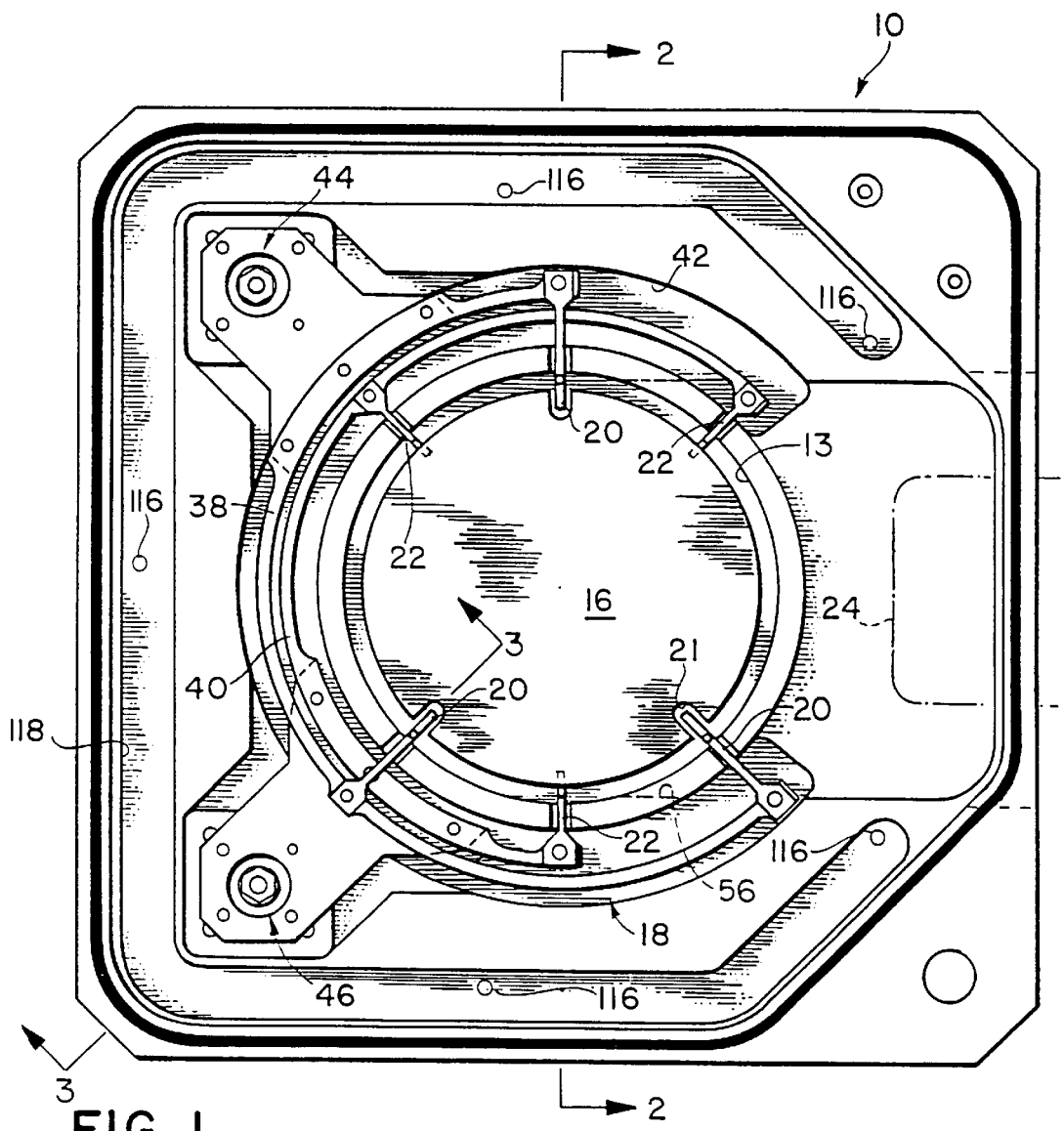
FIG. 1 is a top plan view of a preferred embodiment of the combined CVD/PECVD reactor of the present invention, shown with the cover pivoted open.
Figure 2:
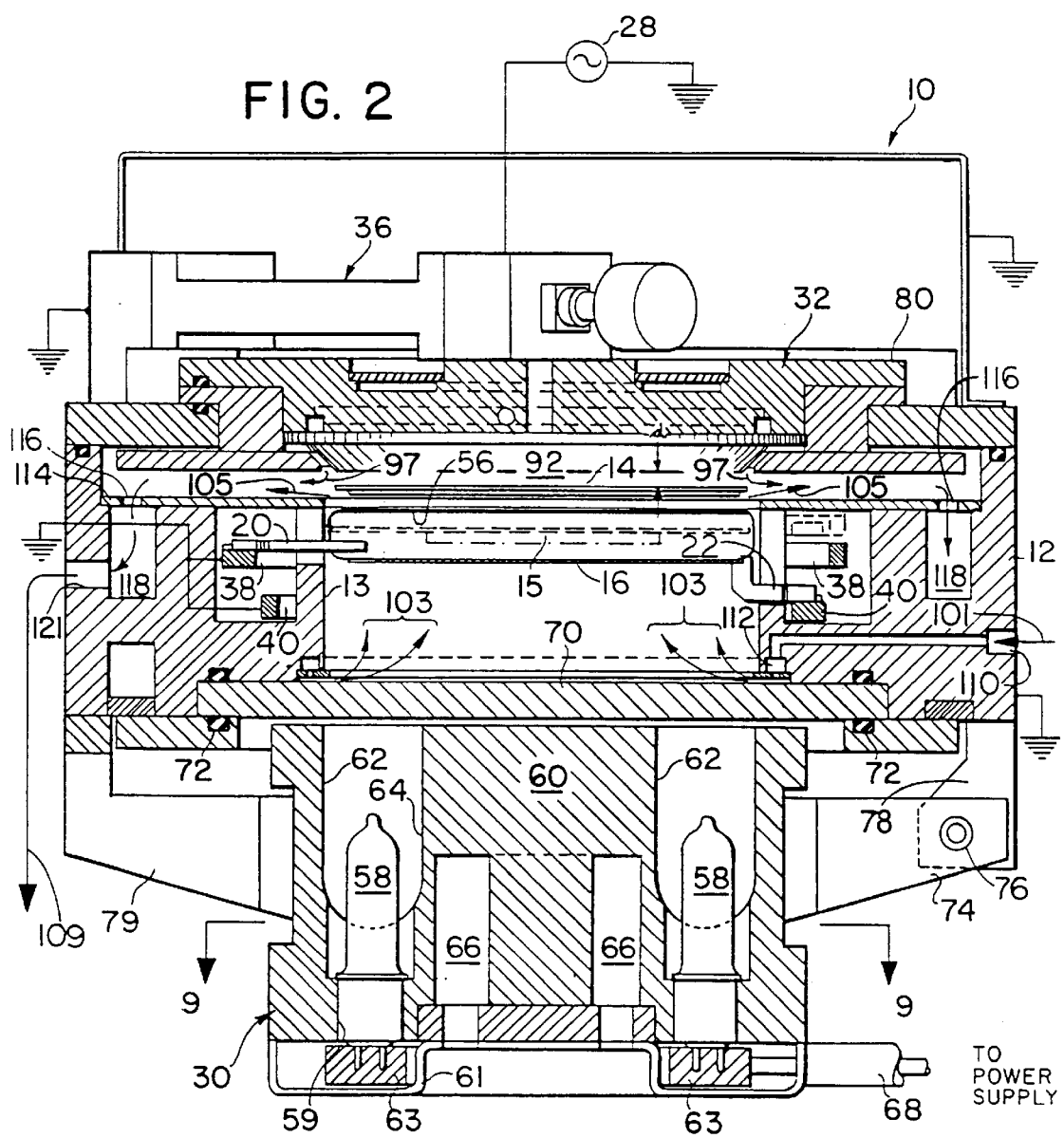
FIG. 2 is a vertical cross-section, partly in schematic, taken along line 2—2 in FIG. 1, with the reactor cover closed.

FIGS. 1 and 2 are, respectively, a top plan view of the preferred embodiment of the single wafer, reactor 10 of our present invention, shown with the cover pivoted open, and a vertical cross-section of the reactor 10.

Figure 6:
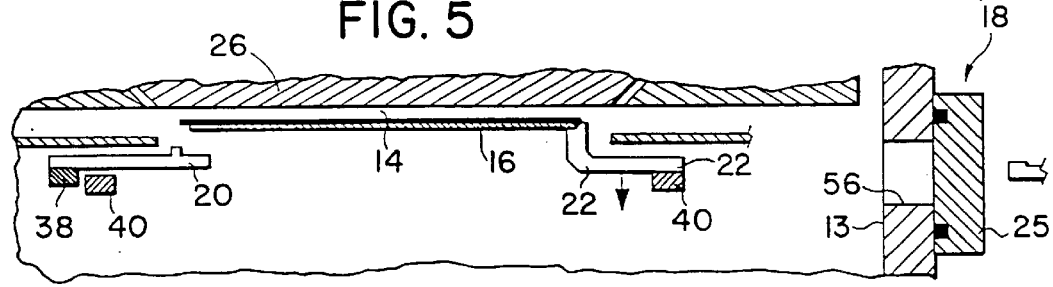

Referring primarily to these two figures and to others indicated parenthetically, the reactor system 10 comprises a housing 12 (also termed a "chamber"), typically made of aluminum, which defines an inner vacuum chamber 13 that has a plasma processing region 14 (FIG. 6). The reactor system 10 also includes a wafer-holding susceptor 16 and a unique wafer transport system 18 (FIG. 1) that includes vertically movable wafer support fingers 20 and susceptor support fingers 22. These fingers cooperate with an external robotic blade 24 (FIG. 1) for introducing wafers 15 into the process region or chamber 14 and depositing the wafers 15 on the susceptor 16 for processing, then removing the wafers 15 from the susceptor 16 and the chamber 12. The reactor system 10 further comprises a process/purge gas manifold or "box" 26 that applies process gas and purging gas to the chamber 13, an RF power supply and matching network 28 for creating and sustaining a process gas plasma from the inlet gas and a lamp heating system 30 for heating the susceptor 16 and wafer 15 positioned on the susceptor to effect deposition onto the wafer. Preferably, high frequency RF power of 13.56 MHz is used, but low frequencies can be used.

The gas manifold 26 is part of a unique process and purge gas distribution system 32 (FIGS. 2 and 10) that is designed to flow the process gas evenly radially outwardly across the wafer 15 to promote even deposition across the wafer and to purge the spent gas and entrained products radially outwardly from the edge of the wafer 15 at both the top and bottom thereof to substantially eliminate deposition on (and within) the gas manifold or box 26 and the chamber 12.

A liquid cooling system, which includes channels 82, 84 and 86 shown in FIG. 10, controls the temperature of the components of the chamber 12 including, in particular, the temperature of the gas manifold or box 26. The temperature of the gas box components is selected to eliminate premature deposition within the gas box/manifold 26 upstream from the process chamber 14.

The reactor system 10 includes a unique, RF/gas feed-through device 36 (FIGS. 2 and 12) that supplies process and purge gas to the RF-driven gas manifold 26 from an electrically ground supply. Applying the RF energy to the gas box or manifold 26 has the advantage of the wafer residing on the grounded counter electrode or susceptor 16, which makes possible a high degree of plasma confinement that would not be achievable if the RF energy were applied to the wafer and the gas box were grounded. Additionally, the hardware is mechanically and electrically simpler since electrical isolation between wafer/susceptor and chamber is not required (or permitted). Temperature measurement and control of the susceptor/wafer in the presence of high frequency electric and magnetic fields is greatly simplified with the susceptor 16 grounded. Also, the feed-through 36 is rigid, eliminating flexible gas connections and the purge gas flow path safely carries any leaking process gas into the chamber to the chamber exhaust. The capability to apply RF power to the gas manifold is made possible (despite the inherent tendency of high potential RF operation to form a deposition plasma within the feed-through) by the unique design of the feed-through, which drops the RF potential evenly along the length of the feed-through, thus preventing a plasma discharge within.

B. Wafer Transport System 18

As mentioned, this system is designed to transfer individual wafers 15 between the external blade, FIG. 2, and the susceptor 16 and to position the susceptor 16 and wafer 15 for processing. Referring further to FIG. 1, the wafer transport system 18 comprises a plurality of radially-extending wafer-support fingers 20 which are aligned with and spaced about the periphery of susceptor 16 and are mounted to a semi-circular mounting bar or bracket 38. Similarly, an array of radially-extending susceptor-support fingers 22 are spaced circumferentially about the susceptor 16, interdigitated with the wafer support fingers 20, and are mounted to a semi-circular bar 40 positioned just outside bar 38. The arcuate mounting bars 38 and 40 are mounted within a generally semi-circular groove 42 formed in the housing, and are actuated respectively, by vertically movable elevator assemblies 44 and 46.

Figure 3:
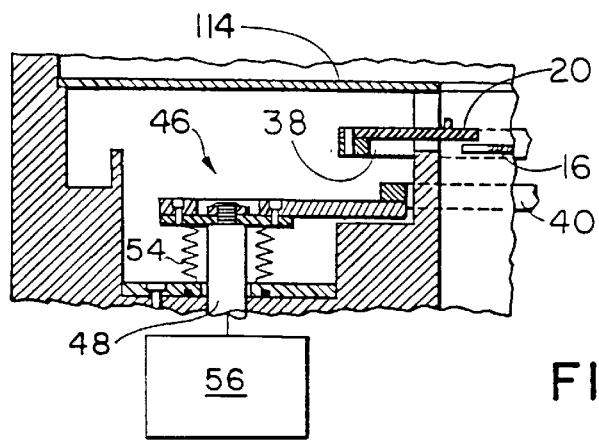
FIG. 3 is a vertical cross-section through the wafer elevator mechanism, taken along line 3—3 in FIG. 1.

As shown in FIG. 3, the susceptor elevator mechanism 44 includes a vertically movable shaft 48 that mounts the bar 38 at the upper end thereof. The shaft can be moved vertically up and down by various moving means 56, including a pneumatic cylinder, or, preferably, a stepper motor operating via suitable gear drive. Wafer elevator mechanism 46 is similar to the elevator 44.

Figure 4:
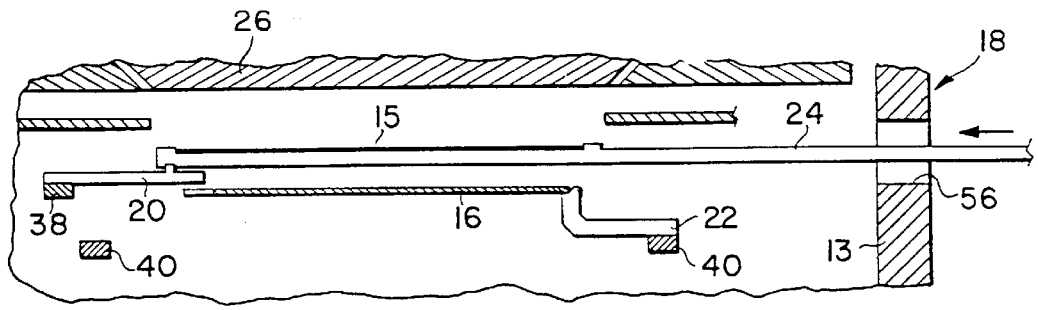
FIGS. 4–8 are sequential, highly schematized representations of the operation of the wafer transport system in positioning wafers within, and removing wafers from the reactor susceptor.

The operation of the wafer transport system 18 is summarized by the sequence depicted schematically in FIGS. 4–8. In FIG. 4, the external blade 24 (with the wafer 15 to be processed supported thereon) is inserted via opening 56 into chamber 13 to a position over the susceptor 16. One example of a suitable blade 24 and associated robot wafer handling system (and door 25, FIG. 6) is described in commonly assigned U.S. Pat. No. 4,951,601, entitled "Multi-Chamber Integrated Process System", issued to Dan Maydan, Sasson Somekh, David N. K. Wang, David Cheng, Masato Toshima, Isaac Harari, and Peter Hoppe which patent is hereby incorporated by reference in its entirety. In this starting position, the wafer fingers 20—20 are positioned between the susceptor 16 and the blade 24.

Figure 5:
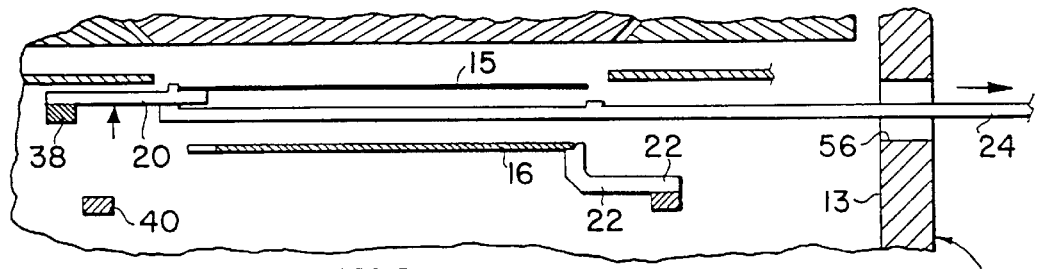

Next, as shown in FIG. 5, the wafer elevator mechanism 44 raises the wafer-support fingers 20—20 above the blade 24 to pick up the wafer 15. The blade 24 is then withdrawn from the chamber 13.

As shown in FIG. 6, after retraction of the blade 24, a pneumatic cylinder closes door 25 over the blade access slot 56 to seal chamber 13. The susceptor elevator mechanism 46 is actuated to raise the susceptor-support fingers 22 and susceptor 16 so that the susceptor 16 lifts the wafer 15 from the fingers 20—20 into position for processing in the area 14 immediately adjacent the gas distribution manifold 26. The spacing, d, between the wafer 15 and manifold 26 is readily selected by adjusting the travel of the elevator 46. At the same time, the susceptor fingers 22 and elevator mounting 46 maintains the horizontal orientation of the susceptor 16 and wafer 15 and parallelism between the wafer 15 and manifold 26 independent of the spacing, d.

Figure 7:
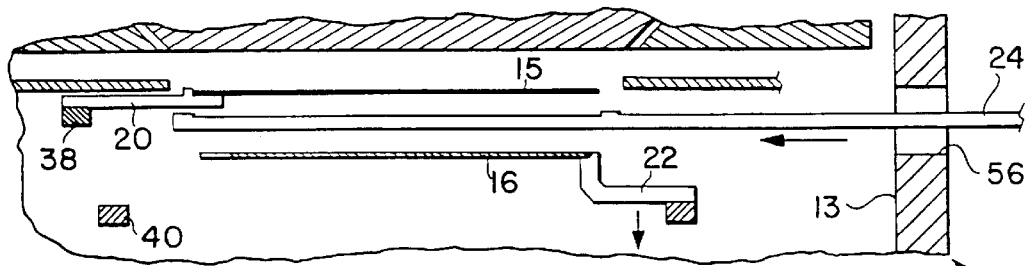
Figure 8:
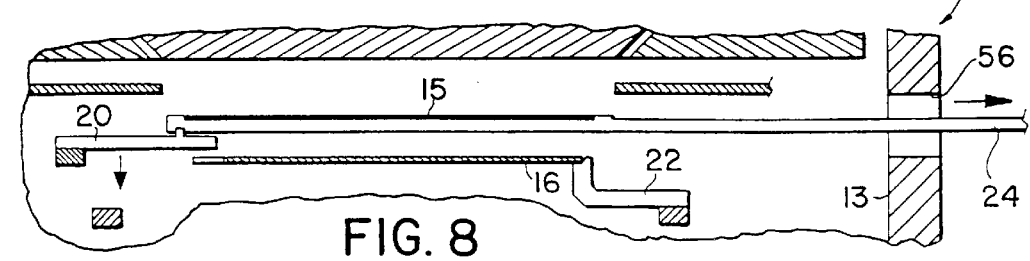

After processing, and referring to FIG. 7, the susceptor elevator mechanism 46 lowers the susceptor fingers 22 and the susceptor 16 to deposit the wafer 15 on the wafer support fingers 20—20. The door 25 is then opened and blade 24 is again inserted into the chamber 13. Next, as shown in FIG. 8, elevator mechanism 44 lowers the wafer-support fingers 20—20 to deposit the wafer 15 on the blade 24. After the downwardly moving fingers 20—20 clear the blade 24, the blade is retracted, leaving the fingers 20 and 22 in the position shown in FIG. 4 preparatory to another wafer insertion, processing and withdrawal cycle.

C. Near-IR Radiant Heating System 30

Figure 9:
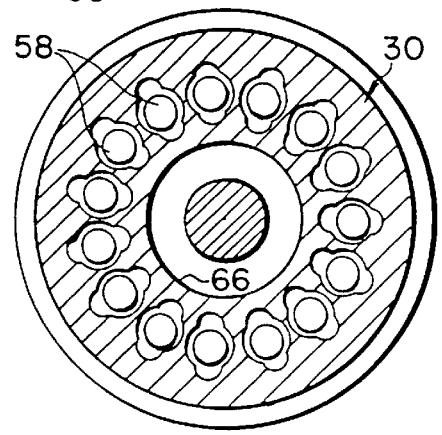
FIG. 9 is a reduced scale, horizontal cross-section through the circular-array, radiant lamp heating assembly, taken along line 9—9 in FIG. 2.

The radiant heating system shown in FIGS. 2 and 9 provides a reliable, efficient and inexpensive means for heating the circular susceptor 16 and wafer 15 (e.g., silicon) in a manner that provides uniform wafer temperature, accurate absolute wafer temperature and rapid thermal response at low temperatures, preferably $\leq 600°$ C. In achieving these objectives, a number of requirements must be met. First, achieving uniform wafer temperature requires compensating the radiation losses at the edge of the wafer. Secondly, high efficiency at low wafer temperatures ($\leq 600°$ C.) requires a high emissivity, high thermal conductivity susceptor 16 because silicon wafers have low emissivity at low temperatures in the near-infrared spectrum. In addition, near-infrared radiation is used to obtain fast heating response and for transmission through the inexpensive materials such as quartz window 70. The circular thin susceptor 16 is low thermal capacitance for fast heating and cooling response. These and the other objectives discussed below are achieved by the radiation heating system 30 shown in FIGS. 2 and 9.

The heating system 30 preferably comprises an annular array of small, inexpensive, single-ended vertically oriented lamps 58—58 which provide radiation in the near-infrared portion of the electromagnetic spectrum. The lamps 58—58 are mounted within an annular circular reflector module 60, preferably of aluminum. The module base 60 is formed from a block of aluminum, and has a polished annular reflecting channel 62 machined therein. The channel 62 has an arcuate, generally semi-circular reflecting base 64. The module 60 and lamps 58—58 are cooled by an annular cooling passage 66 that is formed within the collimating annular reflector 62.

Connections are provided for the inlet and outlet of cooling liquid which, typically, is chilled water from a pressurized supply. Power is supplied to the lamp sockets 63 and associated lamps 58 by an electrical supply cable 68, typically from a variable power supply which automatically varies the lamp power based upon a predetermined program setting that is adapted to the requirements of the particular deposition process.

The annularly-collimated light from the vertical oriented lamps 58—58 is admitted into the chamber via a quartz window 70. Quartz is transparent to near-IR radiation. The transparent quartz window 70 is mounted to the housing 13 at the bottom of the process chamber 13 using annular seals 72—72 to provide a vacuum-tight interface between the window 70 and the housing. This mounting arrangement positions the radiant energy heating source 30 outside the chamber 13 at atmospheric pressure and isolates the vacuum of the processing chamber and the particulate-sensitive processing therein from the lamps. A bracket 74 can be joined to the lamp mounting base 60 and pivotally mounted by pivot pin 76 to a mating bracket 78, which is joined to the housing 12. (Alternatively, the lamp module can be bolted in place.) As a consequence of this pivotal mounting of the lamp assembly 30 external to and isolated from the process chamber 13, the lamp assembly is readily accessible for maintenance, lamp replacement, etc., by simply disengaging a clamp 79 to allow the assembly to pivot downwardly about pin 76.

As mentioned, the lamps 58—58 are small single-ended commercially available quartz-tungsten-halogen lamps which provide the required near-infrared radiation. One suitable lamp is the Ansi type "FEL" supplied by Sylvania, G.E., Ushio or Phillips. Presently, fourteen 0.5 to 1 kilowatt quartz-tungsten-halogen lamps that provide a wavelength of about 0.9 to 1.5 micron provide an annularly-collimated power density of up to about 94 W/cm$^2$ at the top of the lamp module. The maximum power density at the susceptor (substantially directed to the outer ~1.5 in. radius of a 6 in. diameter susceptor) is ~17 W/cm$^2$ taking all efficiency into account (~15–16% efficiency). More generally, lamps concentrating their radiation in the range of about 0.7 to 2.5 microns wavelength would be particularly useful. The aluminum base 60 and concave-bottom, annular groove 62 provide a high collection-efficiency collimating reflector which directs a higher radiation power density at the susceptor edge than at the middle. This non-uniform, concentrated radiation heats the susceptor wafer circumferentially, which compensates the wafer edge heat losses and, thus, provides uniform wafer temperature over a wide range of chamber gas pressures and wafer temperatures.

In short, the desired uniform radiant wafer heating is provided by small, inexpensive lamps mounted in a compact simple aluminum module 60 that is easily cooled and maintained at a low temperature, and does not require plating. In addition, the use of the near-IR lamps and a thin, low mass, low thermal capacity, high emissivity susceptor of material such as graphite, provides maximum efficiency, fast thermal response, excellent temperature uniformity and transmission through the quartz window 70. Other susceptor materials include anodized aluminum, graphite coated with layers such as aluminum oxide ($Al_2O_3$), or silicon carbide, or a composite ceramic coated with $Al_2O_3$ or SiC or other materials. Also, interchangeable modules 60 having channels of different heights or diameters can be used to accommodate different susceptor and wafer diameters. A present version of the reactor is designed for 5–6 in. wafers. However, different lamp modules can be provided for smaller or larger diameter wafers by changing the module height and/or the radius of the module and the filament circle. Finally, the heating system 30 may employ a controller (not shown) such as a closed loop temperature control system using phase angle power control to provide rapid thermal response and rapid wafer temperature stability.

It should be noted that the simplicity, low mass and high performance characteristics of the heating system 30 are in contrast to prior wafer heating approaches which typically use a rectangular array of double-ended quartz-tungsten-halogen lamps. Conventional radiation heating practice has been to use a more massive susceptor and, if excellent temperature uniformity is required, to merely block radiation from the wafer center, thus sacrificing efficiency, rather than redirecting radiation. The advantages of the radiant heating system 30 over the conventional practices include in addition to the aforementioned uniform wafer temperature and much faster response time (both heating and cooling), smaller, less bulky more easily maintained equipment of higher reliability (long lamp lifetime); more efficient operation; and lower cost.

The use of the easily accessible, external radiant heat source 30 is facilitated and maintained by a gas purge system. As described in the succeeding section, this system directs purge gas flow across the vacuum side of the quartz window 70 to prevent deposition on the window and keep the window clean. Thus, the purge is a major contributor to lamp efficiency. This increases the number of process cycles between cleaning and, as a result, decreases the associated system downtime required for cleaning.

D. Gas Manifold 26 and Associated Distribution System

The gas distribution system 32 is structured to provide a unique combination of at least four structural features. First, the gas manifold 26 is one-half (the powered half) of an electrode pair. The powered manifold 26 provides high power. Second, the gas manifold 26 and other gas distribution surfaces are temperature controlled, which contributes to uniform deposition on the wafer 15 and prevents gas decomposition, deposition or condensation within the gas distribution system upstream from the plasma processing area 14 despite the use of reactant gases such as TEOS which condenses at ~35° C. and decomposes or reacts with ozone at ~75° C. The external manifold temperature is controlled, e.g., to >100° C., to prevent the deposition of flaky, particulate-causing deposits. Third, the gas manifold 26 and gas distribution system 32 provide a clean, uniform deposition process. Fourth, the incorporated circumferential purging gas flow prevents deposition outside of the gas distribution area, i.e., outside the wafer on the internal chamber surfaces and gas distribution system surfaces.

The above features of gas distribution system 32 are depicted most clearly in the FIG. 2 vertical section view and the FIG. 10 enlarged vertical section view. The gas manifold 26 and associated distribution system are part of the housing cover 80, which is pivotably mounted to the housing 12 by pivot means (not shown) to facilitate access to the interior of the housing, including chamber 13, plasma process chamber 14, and associated internal components of the wafer and susceptor elevator mechanisms (44,46).

The process gas flow from the feed-through 36 is directed into the cover 80 by inlet bore 88 which communicates with, that is, feeds into, gas manifold chamber 90 formed by the apertured manifold face plate 92. A uniquely designed baffle plate 94 is mounted within the gas manifold chamber 90 by means such as standoffs (not shown) to route the process gas around the outside of the edge of the baffle 94 and then radially inwardly along the bottom of the baffle and out the apertures 96—96 in the manifold plate into the plasma processing region 14 above wafer 15.

The cover 80, including the manifold 26 thereof, is heated (or cooled) by an internal flow of fluid or liquid such as de-ionized water along internal path 81 defined by inlet channel 82, annular channel 84 and outlet channel 86. Preferably, this flow keeps the face plate 92 within the range 100° C.–200° C., in order to ensure that any deposition on the face of the gas manifold which is exposed to the plasma is a hard film. A poor film formed on this surface can create particulates and this must be avoided. Also, the flow preferably holds baffle 94 within the range, most preferably within 35° C.–65° C., to prevent internal deposition or condensation of low vapor pressure process gases such as TEOS and to prevent decomposition and reactions of gases such as TEOS and ozone. Please note, such deposition is directly proportional to time, temperature (t,T). Thus, the very small gap "d" of about 0.1 to 0.2 inches between the plates 94 and 92 also decreases any tendency to internal deposition.

As an example, in one process application involving the deposition of silicon dioxide, oxygen, TEOS and a carrier gas are inlet from manifold 26 to the chamber 14 at chamber pressure of 0.5–200 torr to form a reactant species for deposition. Wafer 15 is heated to 375° C., and hot de-ionized water (water temperature 40° C. to 65° C.) is inlet along path 81 at an adequate flow to keep plate 92 at <65° C., to prevent condensation of the TEOS, and to keep plate 94 >100° C. (De-ionized water is used because the manifold 26 is the RF powered cathode and de-ionized water is a non-conductor.) More generally, the inlet temperature of the water is selected as required for a particular deposition process and its associated gas chemistry and/or other parameters in order to maintain both the internal surfaces and the external surfaces of the gas box 90 at desired temperatures.

To reiterate, the process gas flow is along path 91 defined through inlet bore 88, into manifold chamber 90, radially outwardly to the edge of baffle 94 and around the baffle periphery to the bottom thereof, then radially inwardly between the baffle 94 and the manifold plate 96 and out holes 96—96 into the plasma processing region 14 above the wafer 15. The flow path of the deposition gas emerging from holes 96—96 is generally radially outwardly across the wafer.

In addition, the small volume of the vacuum process chamber 14 and the high useful chamber pressure range of about 0.5 torr to near-atmospheric pressure also contribute to the tendency to provide a uniform flow radially outward from the center of the wafer 15 with uniform deposition on the wafer and purging without deposition other than on the wafer.

The manifold holes 96—96 are designed to promote this uniformity of deposition. The holes (as well as the manifold temperature, discussed above) are also designed to avoid the formation of deposits on the manifold outer (bottom) surface 97 and, in particular, to prevent the deposition of soft deposits on surface 97 which could flake off and drop onto the wafer during and after processing. Briefly, the hole array is one of generally concentric rings of holes 96—96. The distances between adjacent rings (ring-to-ring spacings) are approximately equal, and the hole-to-hole spacing within each ring is approximately equal. However, the patterns are angularly staggered so that no more than two adjacent holes (or some other selected number) are aligned radially. That is, the holes in the gas distribution plate 92 are equally spaced on circles so the hole locations do not form radial straight lines, thereby substantially decreasing deposition on the gas distribution plate itself and enabling uniform gas flow and deposition on the wafer.

The hole length through the manifold 92, i.e., the thickness of the manifold plate 92, and the transverse hole diameter are also selected to promote uniform deposition. Increasing/decreasing the hole length has the effect of decreasing the deposition thickness inside-out/outside-in, as does increasing/decreasing the hole diameter.

In a presently used configuration, approximately 3400 holes 96—96 are used. The hole length is 0.100 to 0.150 in., the hole diameter is 0.028 to 0.035 in. and the radially asymmetric holes are located on approximately 0.090 in. centers. These dimensions and the associated configuration provide a uniform flow pattern and substantially decrease deposition on the manifold plate 92. The present ~6 in. manifold diameter will accommodate wafer diameters as large as ~6 in. Larger wafers can be processed by changing to a larger manifold 26, susceptor 16, larger diameter susceptor 16 and wafer support finger arrays, and by altering the lamp module 30 as described previously.

Referring further to FIG. 10, as indicated by the arrows 93, 95, 97 a first, upper purge gas flow path is provided in cover 80 and manifold 26. That is, purge gas flow from the RF/gas feed-through 36 is routed into inlet bore 98 in cover 80 (arrow 93) which feeds into radial channels or grooves 100 that in turn feed into an annular groove 102 formed in the cover concentric with and just above and outside the manifold chamber 90 (arrow 95). A ring flow turner 104 is mounted concentrically within manifold plate rim 85 and forms a peripheral channel 106 at the inside of the manifold rim that connects the annular channel 102 to the three outer rows of apertures 108 in the manifold plate 92.

Figure 11:
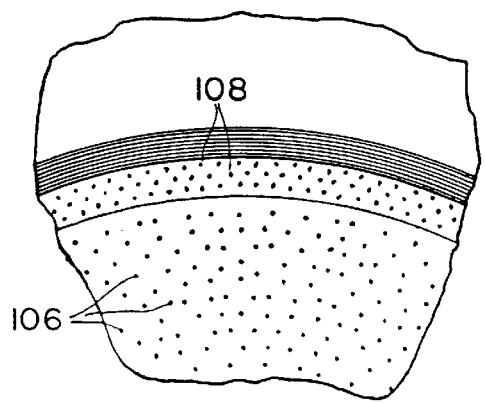
FIG. 11 is a partial, enlarged bottom plan view of the gas distribution head or manifold.

As shown in FIG. 11, the purge holes 108—108 are arranged similarly to the process gas holes 106—106 in generally concentric rings that are spaced at approximately equal ring-to-ring distances. The within-ring hole spacing is selected so that the locations of the purge holes 108—108 form staggered radial lines, i.e., so that no two adjacent purge holes are along a radial line. For the above-described exemplary manifold, the gas is distributed from about 600 holes and the following purge hole dimensions are used: between-ring spacing 0.090 in.; hole diameter 0.025 in.; and hole length 0.040 in.

Referring to FIG. 2, a second, lower purge flow path 101, 103, 105 is provided via inlet bore 110, formed in the side of the housing 12, which connects or feeds into an annular channel 112 formed generally concentrically about the lower section of the process chamber 13 just above the quartz window 70. The channel 112 has holes that are spaced about the lower region of the chamber 13 or equivalent yielding feature to feed the lower purge gas uniformly across the quartz window 70 (see arrows 103), around the lower edge of the wafer 15 (arrows 105) and across horizontal quartz cover plate 114, which surrounds the chamber 13 just below the wafer processing chamber 14. Referring also to FIG. 1, the plate 114 contains an annular pattern of holes 116 therein which are aligned with an annular gas outlet channel 118. This channel is connected via outlet bore 121 to a conventional vacuum pumping system (not shown), which establishes the vacuum within the chamber and exhausts the spent gases and entrained gas products from the chamber.

As mentioned (see FIG. 10), the upper purge gas flow is through inlet 98 (arrow 93), channels 100, 102 and 106 (arrow 95), then out purge ring apertures 108—108 (arrow 93) at the outer upper edge of the process-positioned wafer 15. Simultaneously (see FIG. 2), the lower purge gas flow is through inlet 110 (arrow 101) and annular ring 112 across the quartz window 70, sweeping the window clean (arrow 103), then upwardly toward the lower peripheral bottom edge of the wafer 15 (arrow 105). Referring to FIG. 10, the upper and lower gas purge flows 97 and 105 merge at the wafer's edge and flow outwardly as indicated by arrow 107 across the plate 114 and through the holes 116 therein into the annular exhaust channel 118 and out of the chamber along path 109 (FIG. 2). This upper and lower, merging flow pattern not only keeps the quartz window 70 clean, but also sweeps spent deposition gases, entrained particulates, etc., out of the chamber 13. The combination of the dual, upper and lower purge flows which are conformed to the inner quartz window chamber surfaces and to the circumferential wafer edge and the very high chamber pressures (unusually high for PECVD) provide a very effective purge and prevent deposition external to the wafer.

Equally important, uniform radial gas flow is provided across the wafer 15 by the multiplicity of holes 116—116, illustratively five in number, which are formed in the distributor plate 114 peripherally around the wafer 15. These holes 116 communicate into the larger semi-circular exhaust channel 118 which, in turn, is connected to the vacuum exhaust pumping system via the single outlet connection 121. The channel 118 has large conductance relative to the holes 116—116 because of its relatively very large volume, which provides uniform pumping at all points radially from the wafer, with the simplicity of a single point pump connection. In combination with the uniform gas flow distribution inlet pattern provided by manifold 26, this uniform radial pumping provides uniform gas flow across the wafer 15 at all pressures and, thus, uniform deposition even at very high chamber pressures such as 200 torr and above. Also, the manifold 26 is usable as an electrode for a uniform glow discharge plasma at unusually high pressures, which enables both the very high deposition rate and the effective purge flow.

E. Anti-Electrical Breakdown Gas Feed-Through 36

As mentioned, the advantages of using the gas box 26 as the powered RF electrode include the wafer residing on the grounded counter electrode, which makes possible a high degree of plasma confinement that would not be achievable if the RF energy was applied to the wafer and the gas box was grounded. Additionally, the hardware is mechanically and electrically simpler since electrical isolation between wafer/susceptor and chamber is not required (or permitted). Temperature measurement and control of the susceptor/wafer in the presence of high frequency electric and magnetic fields is greatly simplified with the susceptor grounded.

However, applying high power, high frequency, large potential RF energy to a conventional gas distribution system and, in particular, across a short distance between metallic gas tubing and gas manifold normally would cause premature electrical breakdown of the process gas within the distribution system upstream of the plasma processing chamber. In other words, in conventional systems the RF voltage would create a plasma within the distribution system, which would cause unwanted deposition of the process gas on the internal surfaces of the gas distribution system.

Our combination RF/gas feed-through 36 (FIG. 12) is designed to apply RF power to the gas box 26, that is, to use the gas box as the powered RF electrode, without breakdown of the process gas and without deposition within the gas distribution system.

Also, consistent with one of the overall objectives of achieving a small, compact CVD reactor, the RF/gas feed-through 36 is of a compact, low profile design, despite our design objective that the high RF potential be applied parallel to the gas flow path to yield a constant voltage gradient over a distance to eliminate the high local electric field which causes electrical breakdown.

It should be mentioned that prior gas feed-throughs are incapable of achieving the above objectives. Two such prior art approaches are known to us. The first approach flows the gas within an insulating tube between surfaces that are at a high electric potential difference. A second approach flows the process gas through an insulator between the surfaces of high electric potential difference at sufficiently high gas pressure so that electrical breakdown does not occur. The first approach is not compact and does not work at high frequencies, where electrical breakdown is more efficient (see, e.g., curve 201 and 200, FIG. 14). Also, this first approach is not capable of operation where there is a small p-d (pressure-distance) product. The second approach is more compact than the first, and less susceptible to electrical breakdown at high frequencies, but is also subject to electrical breakdown where there is a small pressure-distance product.

Referring now to FIG. 2 and, primarily, to FIG. 12, the feed-through 36 comprises an inlet end connector or manifold 120, an outlet end connector or manifold 122 and an intermediate gas feed structure 124 comprising a quartz tube 126 and an elongated insulating transition housing 128. The block 128 is mounted to and between the end connectors 120 and 122 using O-ring seals 130—130 to provide vacuum-tight mounting. The internal bore 127 of the quartz tube 126 communicates with gas inlet bore 134 in the inlet end connector and gas outlet bore 136 in the outlet end connector.

Process gases and purge gas under pressure from sources such as an ozone generator, a liquid-TEOS vaporizer, and conventional pressurized gas tanks or bottles are routed through conventional valves or an automatic flow control system for controlled flow rate application to the inlet manifold 120.

As indicated by arrows 131—135, process gas is routed through the feed-through device 36 via the inlet bore 134 and through the quartz tube 126 and out the outlet bore 136 and into the mating inlet bore 88 in the gas distribution head 32. Please note, the feed-through is shown enlarged in FIG. 12 to facilitate illustration. The actual feed-through 36 is of a size so that the gas outlets 136 and 146 are aligned with the mating channels or bores 88 and 98 in the reactor cover 80.

The purge gases are routed through the feed-through co-axially with the process gas flow path so that if there is a leak along the process gas path 131–133–135, the process gas is harmlessly transported into the process chamber 14 along with the purge gas and, thus, does not escape into the ambient.

The incoming purge gas is applied to inlet bore 138 in the inlet end connector 120. Bore 138 communicates with an annular channel 139 formed in the spool-shaped fitting 140 which is mounted near the inlet end of the quartz tube 126. This spool fitting 140 is sealed at the outer end thereof by cylindrical flange fitting 142 and O-ring seal 144. The annular channel 139 communicates via holes (not shown) with the annular passage 147 between the tube 126 and concentric block 128. The passageway 147 feeds similarly into annular chamber 139 in fitting 140 at the outlet end of the tube 126. The tube 126 is mounted and sealed at the outlet in the same way described above relative to its inlet end. At the outlet end, chamber 139 feeds into the outlet bore 136. This arrangement provides an isolated purge gas flow path through the feed-through 36, as indicated by arrows 148–156.

The co-axial gas feed apparatus described above provides a dual barrier which prevents the leakage of potentially toxic process gases into the atmosphere. That is, the path to the ambient between mating surfaces is barred by the two sets of O-ring seals 130 and 144. These seals are positioned in series along the potential path to the ambient. Also, as mentioned, in the event of internal system leaks such as a leak in the quartz tube 126, the purge gas flow carries the process gas into the process chamber 14, where both are exhausted by the chamber vacuum system. In addition, the process and purge gases are routed entirely through the chamber components, i.e., through substantial blocks/bodies such as the aluminum connectors 120 and 122 and the insulator block 128. Consequently, external, typically flexible, gas tubing is eliminated at the reactor. The very solid, secure routing fixtures, the dual seal barriers, and the co-axial gas flow in which the purge gas flow surrounds the process gas flow, provide a safe, secure process gas flow path in the reactor and feed-through device.

As shown in FIG. 12, the inlet end connector 120 is connected to ground. The outlet end connector 122 is connected to the RF power supply 128 and connects the RF energy to the cover 80 and manifold plate 92. A constant electric potential gradient is provided along the column of process gas flow between the grounded connector 120 and the driven connector 122 by providing one of three types of constant voltage gradient elements along the surface of the quartz insulating tube 26: a radio frequency coil which provides resistive, inductive, or capacitive (effective) impedance; a resistive film; or a resistive sleeve.

Figure 13A:
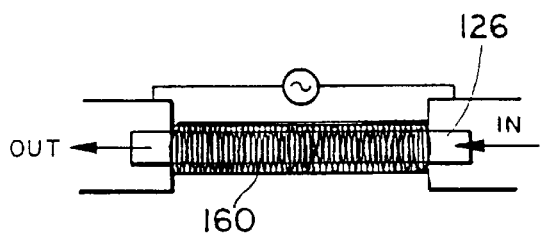

As shown schematically in FIG. 13A, the RF coil 160 is a wire coil that is wound around the quartz gas tube 26 between the ends thereof and the high voltage which is applied across the tube length. Preferably, the wire coil 160 is of No. 24 to No. 26 AWG aluminum wire. The desired electrical impedance at the frequency of operation is obtained by selecting the wire material, diameter, number of turns per unit length, length and the winding technique. This A.C. impedance can be selected to have a net inductive/resistive impedance or a net capacitive/resistive impedance or to be purely resistive (resonant). The A.C. and D.C. resistance can be selected (using wire diameter, length, and material). A typical application has a high inductive reactance but is a D.C. short. For a radio frequency driven system of 13.56 MHz, typical values for the inductance of an RF coil-type feed-through are approximately 10–15 micro-Henries. For the resistive film or sleeve feed-through, a resistance of 100 to 500 Kohms is typical.

Figure 13B:
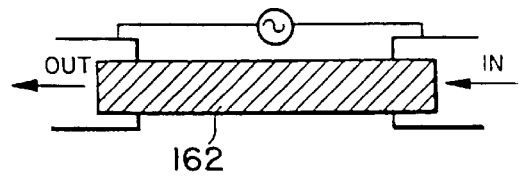

Alternatively, as shown in FIG. 13B, a resistive film 162 of material of controlled electrical resistivity and thickness, such as Acheson "Aerodag G" (a colloidal suspension of micron size graphite particles in an isopropyl alcohol dispersing medium), is coated on the outside of the quartz tube 126 to provide the desired resistive impedance and allow broad band (frequency) operation.

Figure 13C:
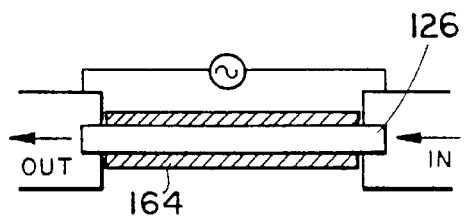

The third alternative shown in FIG. 13C uses a solid resistive sleeve 164 of a material such as a composite ceramic of controlled electrical resistivity, to provide the desired electrical resistive impedance and broad band frequency operation.

Still another alternative, a variant of the solid resistive sleeve 164, uses a sleeve of material which is ferromagnetic with very high permeability at the frequency of interest, and has controlled electrical resistivity. Operation is the same as for the resistive sleeve 164, with this added advantage. Should breakdown occur under severe conditions, the presence of magnetic material and initially high current and resulting high magnetic field produces a very large inductive reactance to charge flux (current), which very quickly reduces then extinguishes electrical conduction in the process gas.

Figure 14:
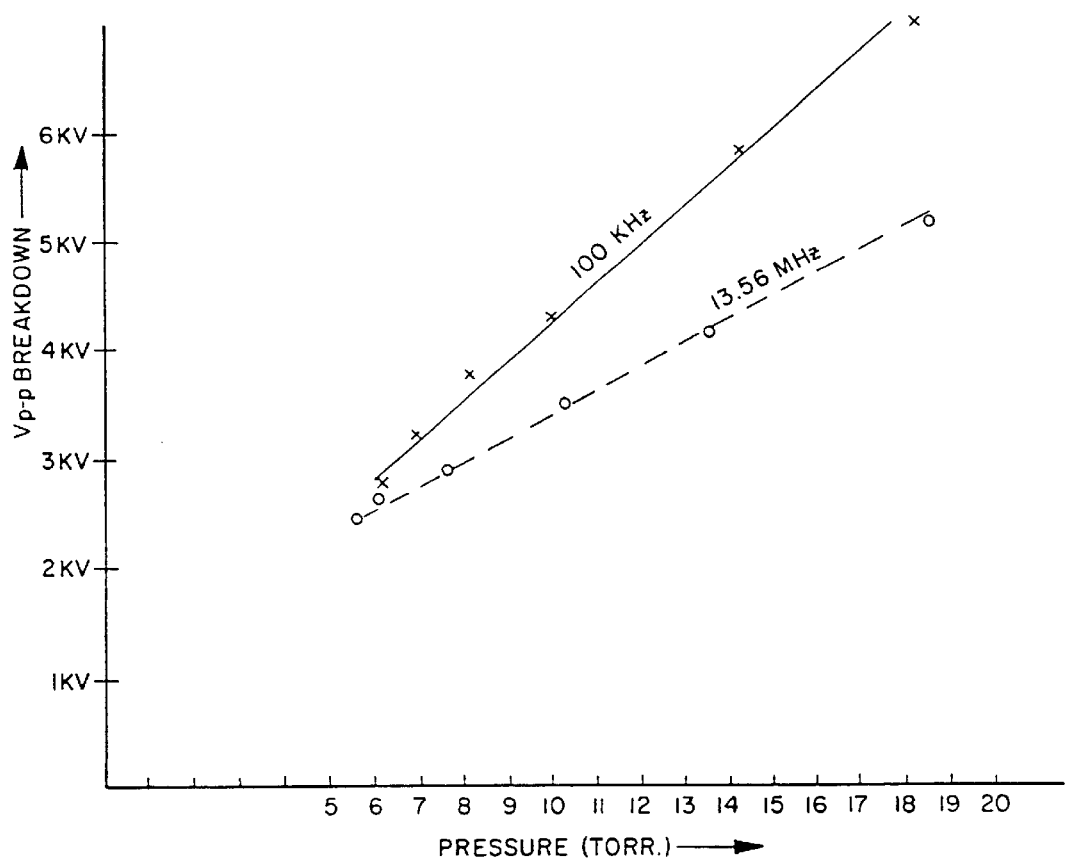
FIG. 14 illustrates breakdown voltage as a function of pressure for low frequency and high frequency RF power without a constant voltage gradient device.

FIG. 14 illustrates representative bench test data for a quartz tube without a constant voltage gradient device of voltage breakdown in kilovolts as a function of pressure in torr at both low (100 kHz) and high (13.56 MHz) radio frequencies. As indicated, for the pressure range of 5–20 torr, the breakdown range was 3 to 7 kV for the low radio frequency and approximately 2 to 5 kV for the high radio frequency.

Figure 15:
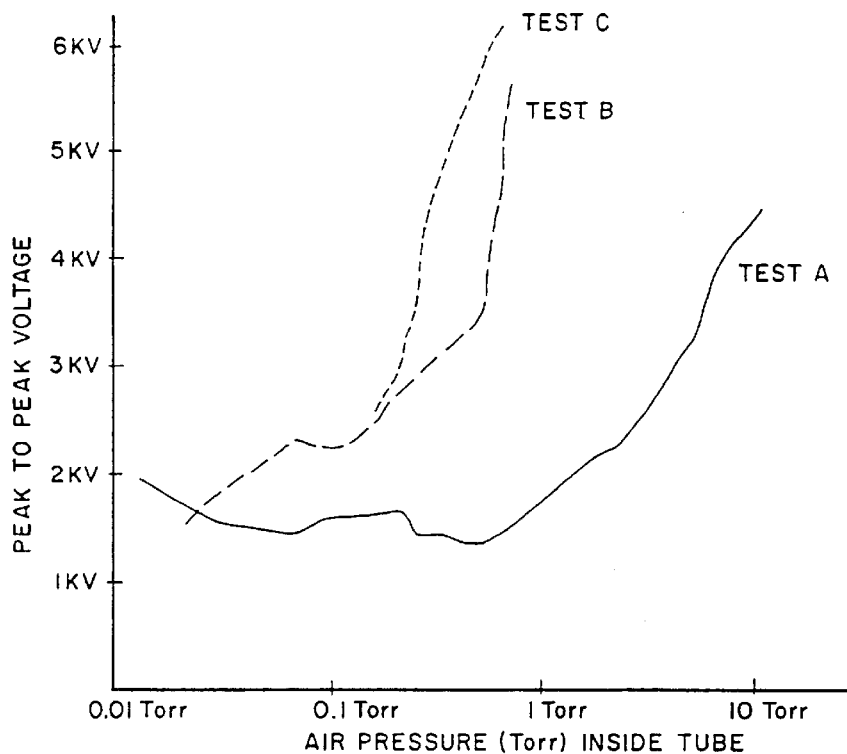
FIG. 15 illustrates breakdown voltage as a function of pressure with and without a constant voltage gradient device.
Figure 16:
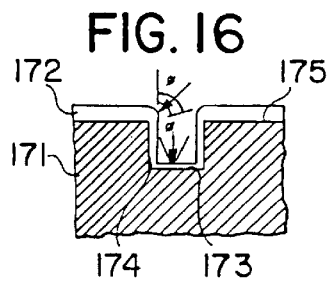
FIG. 16 is a schematic cross-sectional representation of an integrated circuit which illustrates the arrival angles associated with the deposition of a layer of material such as dielectric onto a surface of stepped topography.
Figure 17A:
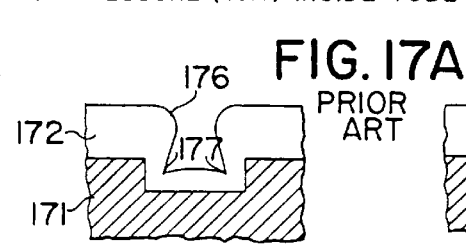
FIGS. 17A and 17B are schematic cross-sections, similar to FIG. 16, which illustrate the effect of trench width on planarization.
Figure 17B:
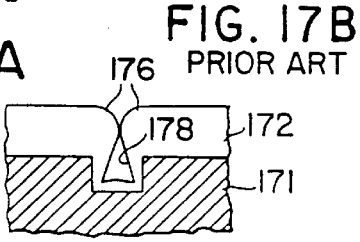

FIG. 15 illustrates bench test data of breakdown voltage as a function of pressure for Tube A, a tube of length 10.5 cm and diameter 0.6 cm without a constant voltage gradient device, and Tube B, the same tube with a constant voltage gradient device of the wire coil type, 160, consisting of 160 turns of ±26 AWG wire. Tube C was the same as tube B, except for having a greater length, 13.4 cm. This illustrates that the RF/gas feed-through 36 is very effective in preventing breakdown and subsequent deposition of process gases under actual reactor operating conditions. In fact, typically the reactor system 10 will be used at pressures of up to 200 torr and above, at which values the breakdown voltages will be much higher than those depicted in FIG. 14.

In short, the anti-electrical breakdown gas feed-through 36 of the present invention provides a constant voltage gradient along the process gas flow column, without charge build-up. In addition, the feed-through 36 is designed to incorporate resistive, inductive or capacitive electrical impedance between the high potential difference ground and driven surfaces. The choice of impedance depends upon the electrical requirements of the system, i.e., low frequency, high frequency, wide band, d.c. operation, etc. This constant electrical potential gradient effectively prevents premature breakdown and deposition within the gas distribution system 32 and feed-through 36 at high or low radio frequencies. In addition, the structure of the feed-through 36 including the co-axial gas feed (the purge gas flow outside the quartz tube and the process gas flow inside the quartz tube) is highly resistant to process gas leaks and purges any process gas leaks into the system exhaust.

Finally, it should be mentioned that temperature controlled water can be flowed through channels (not shown) in the feed-through device 36 isolated from process and purge channels to (heat or cool) control the temperature of the gas in the feed-through. In a typical application which uses gases such as ozone or TEOS, it is important that the gas temperature be controlled so that, for example, condensation (feed-through too cold), decomposition (too hot), or chemical reaction (too hot) do not occur within the tube. Any of the above occurring inside the gas feed-through device could severely affect the desired process. Additionally, if the gases reacted inside the quartz tube, deposition could occur inside the tube.

F. Summary of Certain Key Features

1. Uniform Wafer Heating

Our reactor uses a tailored non-uniform near-IR radiant heating pattern and a thin, low mass high emissivity susceptor to provide thermal efficiency, fast thermal response (heating and cooling), excellent temperature uniformity despite the inherent non-uniform heat losses of thin circular wafers, and good transmission through a chamber window of quartz or the like (which permits external mounting of the radiant heating module).

2. Gas Distribution System

The RF powered gas manifold 26 provides the necessary high power to enable confinement of the plasma. Also, the uniform gas inlet flow pattern provided by the gas manifold and radial exhaust pumping provide uniform gas inlet and exhaust (purge) pumping and uniform radially gas flow across the wafer, enabling uniform processing (deposition/etching) over a wide pressure regime including very high pressures. The radial pumping and high pressure capability provide confinement of the plasma/reactant species to the wafer and; in enabling effective purging, prevent deposition within the chamber except on the wafer. The precisely temperature-controlled internal and external surfaces of the gas manifold prevent decomposition, reactions, condensation, etc., within the gas box and eliminate undesirable particulate-generating deposits on the external gas box surfaces. For example, temperature controlled water is circulated within the gas box to maintain the temperature between about 35° C.–75° C. to prevent internal deposition or condensation of TEOS below about 35° C. and to prevent internal decomposition of or reaction between ozone and TEOS above about 70° C., and to maintain the external face of the gas manifold greater than about 100° C. to prevent flaky external deposits.

3. Gas Feed-Through

The gas feed-through provides the enables the application of high voltage RF power to the gas box, as well as the application of purge gas and process gas to the gas box, without gas breakdown.

4. Wafer Transport System

A one-axis robot susceptor/wafer support and transport system is adapted to load and unload wafers at a selected position within the chamber onto and from an external robot blade. This transport system provides variable parallel close-spacing between the susceptor/wafer and the overlying gas manifold and provides variable spacing by simply selecting the vertical travel of the associated susceptor support fingers and susceptor elevator mechanism. The parallelism increases plasma stability and uniformity by eliminating the tendency to run to one side or the other and, thus, enables uniform processing (deposition and etching). The variable close spacing of the distance, d, between the outer face of the gas manifold and the wafer surface facilitate the implementation of different types of process. Also, the spacing can be set at a very small variable dimension such as, for example, one centimeter, 0.5 centimeter and even smaller, to enable confinement of the plasma and/or gaseous reactants between the gas distributor and the wafer. This confinement increases the reaction efficiency and increases the rate of the reaction (deposition or etching) and helps prevent deposition everywhere except on the wafer, and even at very high chamber pressures.

5. Wide Pressure Range, High Pressure Regime

High pressure capability results from a number of the above-summarized factors including uniform radial pumping, the uniform gas flow provided by the gas manifold, the confinement provided by the variable close spacing between the electrodes and the application of high power density RF power to the gas manifold.

G. Relevance of Features to Multiple Process Capability

The above key features can be summarized as follows: (a) Wide pressure, high pressure regime; (b) Temperature uniformity of susceptor wafer; (c) Uniform flow distribution; (d) Variable close spacing of electrodes (inlet gas manifold and susceptor) with parallelism; and (e) Temperature control of internal/external gas inlet manifold surfaces.

Typically, at least several of these features are very important to each type of processing for which our reactor has been used. These key features are summarized below on a process-by-process basis.

1. Thermal Chemical Vapor Deposition (a) Wide pressure, high pressure regime.
(b) Temperature uniformity of susceptor/wafer.
(c) Uniform flow distribution.
(d) Variable close spacing of electrodes.
(e) Temperature control of internal/external gas inlet manifold surfaces, especially where unstable gases such as TEOS and ozone are used.

2. Plasma-Enhanced CVD (a) Wide pressure, high pressure regime.
(c) Uniform flow distribution.
(d) Variable close spacing of electrodes with parallelism.
(e) Temperature control of internal/external gas inlet manifold surfaces.

Temperature control of the gas box external surface to >100° C. is important to prevent the deposition of porous particulate causing films.

High pressure operation increases ion scattering, which decreases bombardment of and damage to the wafer and enhances step coverage. This, because high pressure operation dilutes the concentration of the gas molecules to the point where they do not react at a sufficient rate to cause particles/unwanted deposition on surfaces. The high pressure capability and associated decreased bombardment enables one to decrease the bombardment level for a given power/voltage and reaction rate or, alternatively, to use higher power/voltage to obtain a higher reaction rate for a given bombardment level. Uniform flow distribution is also critical, particularly at the close spacing of less than one centimeter used in our reactor, because it confines the plasma and thus enhances clean operation. The ability to adjust the electrode spacing with parallelism permits the use of the close spacing with the plasma stability necessary for deposition.

3. Plasma-Assisted Etchback (a) Wide pressure, high pressure regime.
(d) Variable close spacing of electrodes.

The variable large spacing in combination with the high pressure capability permits effective etchback. The variable spacing between electrodes is very important because it would be impossible to optimize the etch and other processes without varying the electrode spacing used for deposition. For example, a typical spacing of <1 cm is used for thermal CVD and PECVD while the etchback requires a spacing of ≈0.4 in. or 1 cm.

4. Reactor Self Clean (a) Wide pressure regime.
(b) Variable close spacing of electrodes (inlet gas manifold and susceptor) with parallelism.

The variable spacing in combination with variable pressure permits effective reactor self-cleaning. Here, the required spacing, d, ≈0.4 in. or 1 cm. is larger than that required for, e.g., thermal CVD and PECVD. The relatively larger spacing and wide pressure regime permits the plasma to diffuse within the reactor (rather than being confined as required for the deposition processes) and clean the entire reactor. A typical self-cleaning sequence uses RF power of 500 watts, gas NF$_3$ or other fluorine containing chemistry at flow rates typically of 0.1 slm, pressure of 0.5 torr, and d ≈0.4 in., and has provided ebb rates of ~0.5 micron/sum.

5. Sputtering Topography Modification (a) Wide pressure, high pressure regime.

(b) Variable close spacing of electrodes (inlet gas manifold and susceptor) with parallelism.

Here, the high pressure capability combined with 0.2 in. spacing as well as the ability to apply RF power to the gas box at high power levels permits sputtering of materials such as oxide or other drelectrics using gas chemistry such as argon or other heavy molecule gas chemistry such as SiCl$_4$. A typical sputtering process involves application of RF power of 700 watts, gas flow rates 0.1 slm, pressure of 10 mt. electrode spacing, d, of 0.2 in. to 0.5 in.

II. Multiple Step In-Situ Planarization Process and Steps

The processing steps and multiple step processing sequences described here were performed in the reactor 10. The ability to perform multiple step processing using temperature sensitive gases such as ozone and TEOS and different steps such as CVD, PECVD, etching, and self-cleaning in-situ qualifies the reactor 10 as being uniquely preferred. However, the process disclosure here will permit those of usual skill in the art to practice the process sequences albeit in single process, dedicated reactors and to adapt such reactors, e.g., to the use of the process.

A. Low Temperature Thermal CVD of Conformal SiO$_2$

The thermal chemical vapor deposition of highly conformal silicon dioxide is an improvement of methods which use the pyrolysis of TEOS and oxygen. The present thermal CVD invention is based in part upon the discovery that improved highly conformal (~100%) silicon dioxide coatings are formed by the thermal chemical vapor deposition of the reactants TEOS and ozone at relatively low temperatures, using lamp radiant heating to provide a wafer temperature of about 200° C.–500° C., and high pressures. The ozone lowers the activation energy of the reaction kinetics and forms silicon dioxide with the TEOS at the relatively low temperatures of about 200° C. to 500° C. A commercially available high pressure, corona discharge ozone generator is used to supply a mixture of (4–8) weight percent ozone in oxygen to the gas distributor. Helium carrier gas is bubbled through liquid TEOS to vaporize the TEOS and supply the diluted gaseous TEOS in the He carrier to the gas distributor.

In particular, the thermal chemical vapor deposition process uses the reactants ozone (O$_3$), oxygen and tetraethylorthosilicate (TEOS) at a low temperature within the range of about 200° C.–500° C. and at a high pressure within the range of about 10–200 torr and, preferably about 40–120 torr, to deposit a highly conformal silicon dioxide coating that fills in the voids, cusps and other topographical irregularities and thereby provide a substantially planar surface. In the presently preferred embodiment, the ozone is applied at a flow rate of 2 to 3 slm, the helium carrier gas flow rate is 50 sccm to 1.5 slm, the chamber pressure is 40 to 120 torr and the wafer temperature is 375° C. ±20° C., thereby providing a highly conformal undoped silicon dioxide coating at a deposition rate of 3,000 Angstroms/min.

As mentioned, the gas distribution manifold (gas distributor 26) of the reactor 10 is controlled by de-ionized water of temperature 20°–50° C. circulating in passages therein to maintain the internal surface of the gas distributor 26 within the narrow range of about 35° C.–75° C., i.e., at a temperature of less than about 75° C. to prevent decomposition of the TEOS and reaction between the TEOS and ozone and above 35° C. to prevent condensation of the TEOS inside the gas distributor.

The distance, d, from the temperature-controlled gas distributor to the surface of the substrate is preferably approximately one centimeter or less. This distance of one centimeter or less confines the plasma or gaseous reactants between the gas distribution 26 and the wafer 15. This increases the reaction efficiency, and increases the rate of the reaction (deposition) and helps to prevent deposition everywhere except on the wafer.

The thermal CVD process of the present invention uses unusually high deposition chamber pressures: pressures of preferably at least ≧10 torr and of about 20–200 torr are utilized. Even the lower portion of this range is over 20 times greater than the total pressure normally utilized in processes utilizing TEOS. The high pressure increases the density of available reactive species and, thus, provides a high deposition rate.

Furthermore, the use of high pressure enables an effective purge. The high purge flow rate improves the ability to remove waste gases, entrained particulates, etc., without unwanted deposition on the chamber surfaces. The above-described bottom purge flow sweeps radially outwardly across the bottom side of the susceptor wafer. The bottom flow is joined by an upper purge flow that is directed downwardly at the wafer's periphery. The combined streams flow radially outwardly from the periphery of the wafer, and cause the deposition gas to flow radially uniformly outwardly, then through the exhaust system of the chamber at very high flow rates. For example, useful top purge gas flow rate (preferably nitrogen) may be from 1 slm to 10 slm and the bottom purge gas flow rate (again, nitrogen) may be 1 slm to 20 slm. These high pressure, high flow rate top and bottom flows purge unwanted gases and particulates everywhere without disrupting the uniform deposition gas distribution at the top of the wafer.

Using the reactor 10, the presently contemplated useful flow rate range of the helium gas (the carrier for TEOS) is 100 sccm to 5 slm (sccm=standard cubic centimeter per minute; slm=standard liters per minute) and the associated ozone, O$_3$, flow is provided by the composition of 4 to 8 weight percent ozone in oxygen flowing at a rate of about 100 sccm to 10 slm. The total gas flow rate, not including the purge gases, typically can be within the range 200 sccm to 15 slm.

The above-described gas flow, chamber pressure, and resulting chamber temperature have provided a silicon dioxide deposition rate of about 500 Angstroms/min. to 4,000 Angstroms/min.

Figure 20:
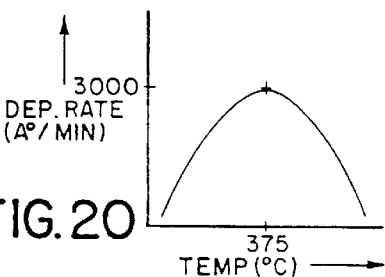
FIGS. 20 and 21 depict the deposition rate as a function of temperature and pressure, respectively, for our present oxide deposition process.

While useful deposition rates of 500 and 400 Angstroms/min. have been achieved at corresponding temperatures of 200° C. and 500° C., as shown in FIG. 20 the deposition rate peaks at about 375° C. ±20° C. The decreased deposition above and below the peak is a consequence of unfavorable reaction kinetics at the surface of the substrate. Fortuitously, the peak temperature is also close to the maximum processing temperature of about 400° C. for aluminum-containing multiple conductor structures. Above ~400° C., hillocks form in aluminum. Above ~500° C., aluminum softens.

Figure 21:
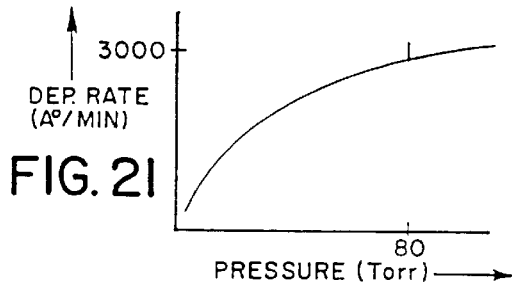

Referring to FIG. 21, using an (ozone and oxygen):helium flow rate ratio of 2:1 (2 slm of 8 wt. percent ozone in oxygen: 1 slm He carrier and TEOS) the deposition rate saturates at 3,000 Angstroms/min. at a chamber pressure of 80 torr, and wafer surface temperature of 375° C. (using a TEOS temperature of 35° C.), with very little increase at higher pressures. Decreasing the temperature to 200°–375° C. at 80 torr decreases the deposition rate to 1,000–3,000 Angstroms/min., respectively. At 20 torr, temperatures of 200°–375° C. provide a deposition rate of 500–1000 Angstroms/min. Above pressures of about 120 torr, gas phase reactions increase particulates. This can be controlled by decreasing the wafer temperature or increasing the diluent flow rate, but these steps decrease the deposition rate.

While the resulting films have been characterized as having improved physical and electrical properties such as cracking resistance, density, refractive index, shrinkage, rate of etching, breakdown voltage, flat band voltage, mobile ion contamination, pin hole density and silicon oxide purities, the crucial aspect is the excellent ~100% conformal coverage over vertical and horizontal surfaces of steps and over other surface irregularities. Consequently, problems such as overhang, cusps and voids are much less severe, thereby minimizing or even eliminating the amount of follow-up processing which must be done to remedy such problems and to achieve planarization.

Furthermore, this high conformality coverage is provided using undoped oxide coatings. Conventional processes use reflowing to smooth the deposited oxide and incorporate phosphorus or boron doping (phosphosilicate glass, PSG, borosilicate glass, BSG, and borophosphosilicate glass, BPSG) to lower the reflow temperature. Our thermal CVD process eliminates the need for reflowing and, thus, the use of PSG, BSG and BPSG and associated problems such as aluminum corrosion. However, if desired, in our thermal CVD process, the conformal oxide could be doped to a low level of, e.g., 1 weight percent to 10 weight percent of phosphorus and/or boron by incorporating reactants such as TMP (tetramethylphosphite) and/or TMB (tetramethylborate). The low concentration doping level would provide sufficient reflow characteristics.

B. Two-Step Planarization Process

In one aspect, the process of the present invention is an improvement of conventional methods for planarizing silicon dioxides such as, for example, conventional methods using spin-on glass and polyimide deposition with etchback.

Another aspect of the present invention is the use of the above-described thermal CVD silicon dioxide deposition process to substantially planarize a dielectric layer, followed by the use of an isotropic wet or dry etch, preferably at a high etch rate, to complete the planarization process. The combination of the above-described low temperature, thermal CVD, conformal oxide deposition process in conjunction with various wet or dry isotropic etch steps provides an unexpectedly conformal, planarized dielectric layer which serves well in the small geometry, multi-level metallization structures that are currently being developed and will be developed in the future. Described below is a presently preferred dry isotropic etch process which can be performed in-situ, in the same, referenced multi-step chamber.

C. Three-Step Planarization Process

In another aspect the present invention is embodied in a three-step process which, first, forms a layer of silicon dioxide, preferably at a high deposition rate; the above-described ozone and TEOS-based thermal CVD conformal oxide deposition process is used as the second step to form a highly conformal oxide coating; then, in the third step, a preferably high rate isotropic etch is applied to quickly complete the planarization process.

D. Preferred Three-Step Planarization Process

In another aspect of the present invention, the above-described thermal CVD, conformal oxide deposition process is used in a three-step high deposition rate, high throughput planarization process in-situ in the referenced multiple process CVD/PECVD deposition chamber. The planarization process can be applied over existing dielectric layers or can be used alone to form a planar dielectric.

The preferred first step is a PECVD oxide deposition. The PECVD oxide deposition process uses a plasma formed from TEOS, oxygen, and a carrier gas with or without a diluent such as helium. This process uses a deposition chamber pressure of from about 1 torr to about 50 torr; an oxygen flow rate of from about 100 sccm to 1,000 sccm, an inert carrier gas (helium) flow rate of from 100 to 1,500 sccm, a total gas flow rate (not including the purge gases) of 200 sccm to 2.5 liters per minute, and RF power to the ~6 in. diameter gas distributor cathode of about 200–400 watts. Power density at the gas distributor/cathode 26 is about 1 watt/cm$^2$ based on calculations for a quasi-parallel plate configuration. Radiant energy is directed to the susceptor from below by the annular array of vertical lamps to generate a deposition plasma and heat the wafer surface to a temperature of 300° to 500° C. Top (nitrogen plus helium mixture) and bottom (nitrogen only) purge gas flow rates of 1 to 15 slm and 1 to 20 slm, respectively, are used with respective preferred top and bottom purge gas flow rates of 2.5 slm and 10 slm. These parameters provide $SiO_2$ deposition rates of about 5,000 Angstroms/min. to 10,000 Angstroms/min. Typically, 0.4 cm$\leq$d$\leq$1 cm.

Presently preferred operating parameters for the PECVD oxide deposition step for a 6 in. wafer are 600 sccm oxygen, 900 sccm helium, 16,000 sccm total flow (including purge; 1,500 sccm excluding the purge), 10 ±2 torr pressure and 375° C. ±20° C. wafer temperature. The parameters provide $SiO_2$ deposition rates of about 8,500 Angstroms/min. for a gas distributor-to-wafer surface distance, d~0.4 cm.

Quite obviously, the above-described high pressure, PECVD oxide deposition process, which is based upon TEOS gas chemistry and has essentially the same chamber requirements as the crucial conformal silicon dioxide deposition step, makes the use of the same chamber not only possible, but preferable.

There are several methods known in the art for depositing silicon dioxide by chemical vapor deposition, including the use of silane and oxygen and pyrolysis of tetraethylorthosilicate (TEOS) at a temperature in the range of 700° to 800° C. at a pressure less than about 5 Torr. This pyrolysis process may be utilized, with a silicon nitride, silane and ammonia plasma, or with an oxynitride, silane, ammonia and $N_2O$ plasma. Plasma-assisted chemical vapor depositions using TEOS at pressures below 1 Torr are also utilized, with variations including use of spin on glass, and polyimides.

The present PECVD process provides methods for improving deposition rate, cracking resistance, physical and electrical properties of CVD-deposited silicon dioxide. The present invention also provides an improved method for depositing silicon dioxide whereby improved step coverage and lower stress of the deposited layer are obtained.

In particular, the present PECVD process provides an improved method for the plasma-enhanced chemical vapor deposition of TEOS to obtain the above advantageous improvements whereby the preferred conditions of deposition are a higher than usual pressures (up to 50 Torr) and at temperatures of about 200° to 400° C. The usual conditions for the plasma-enhanced chemical vapor deposition using TEOS are at a total pressure range of up to about 1 Torr (including the carrier gas), of which the oxygen in the plasma is at a pressure of about 0.4 Torr. During deposition, the substrate temperature usually gradually increases from about room temperature to about 400° C. See, for example, Mackens et al., *Thin Solid Films,* 97:53–61 (1982).

The deposited silicon dioxide coatings according to the present invention also have improved cracking resistance and have improved step coverage over silicon dioxide coatings deposited by other methods. The problem of step coverage deals with the creation of a mushroom-shaped deposited overhang at the corners of the step substrate. This overhang must be removed by subsequent processing, thus complicating the process. By utilizing the process according to the present invention, the problem of the overhang is much less severe, thereby minimizing or even eliminating the amount of processing to remedy this problem.

The silicon dioxide coatings formed according to the present invention also exhibit lower stress and are characterized generally by indices of –IE9 (compression) to +IE9 (tension), with the preferred index being –IE8. Also, the coatings according to the present invention exhibit improved physical and electrical properties and that the density, refractive index, shrinkage parameters, rate of etching, breakdown voltages, flat band voltages, mobile ion contamination, pinhole densities and silicon oxide purity are improved.

Finally, by utilizing the process according to the resent invention, particularly in the apparatus disclosed in the above-identified co-pending application, the operation at high pressures (presently up t about 50 Torr) allows the plasma to be confined at the top of the substrate, thus making it less likely to contaminate the sides of the chamber and the surfaces on which deposits are not desired.

Preferably, the third step is a high rate isotropic etch process comprising the step of exposing the existing silicon dioxide surface to a plasma formed from fluorinate gas selected from $CF_4$, $NF_3$ and $C_2F_6$ in a doping gas such as helium to stabilize the plasma, in a chamber at a temperature in the range of about 100° C. to 500° C. and preferably 200° C. to 400° C. (Helium and/or oxygen can be incorporated to form gases with the carbon.) The total gas chamber pressure for these gases will usefully be in the range of about 200 mt to 20 torr. The preferred range is 500 at to 10 torr. The total gas flow rate of the plasma will be determinable by those skilled in the art. However, an operable range of 20 sccm to 3.5 slm has been found useful for the apparatus disclosed in the referenced multiple process CVD/PECVD reactor. The preferred total gas flow rate is from about 170 sccm to 1.25 slm. The useful range for the $NF_3$ (or $C_2F_6$) gas flow is from about 10 sccm to 500 sccm, with the preferred range being from about 70 to 200 sccm. The individual flow rate of the doping gas, usually helium, will be from about 10 sccm to 3.5 slm and, preferably, 100 sccm to 1 slm. RF power density of about 0.5–1 watts/cm was used, along with radiant power from the lamp module to provide the substrate temperature of <500° C. and the preferred temperature of 200° C.–400° C. A distance d $\geq 0.4$ cm is used. Below 0.4 cm, plasma instability increases. Also, as d is increased above 1 cm, the etch may become too effective and etch other components.

At the relatively high temperatures used, it has been found that rapid accurate isotropic etching of the silicon dioxide is accomplished. Specifically, etching rates of from 500 Angstroms per minute to 1 micron per minute are obtained wherein the etching is isotropically performed and smooth.

While this isotropic etch process is also useful generally, for example, for forming metal contacts, it is particularly useful for providing profile control of $SiO_2$ step-coverage layers, as described above, In particular, this uniform high rate isotropic etch has the advantage of additionally planarizing the substantially planarized contour which results from the $SiO_2$ deposition.

This high rate isotropic etch step was done in-situ in the same reactor used for the two above-described silicon dioxide deposition steps. As a consequence, this preferred sequence provides an integrated in-situ three-step process for forming a planarized silicon dioxide layer even over non-planar layers incorporating small geometry steps, trenches, etc. In combination with the TEOS and ozone-based thermal CVD conformal oxide deposition step, the use of the high rate PECVD oxide deposition step and the high rate etching step, the ability to use the same chamber for all three steps provides a fast, high throughput planarization process which is also less susceptible to contamination and wafer damage and other problems which result when a wafer is handled repeatedly and switched from one chamber to another.

Figure 18:
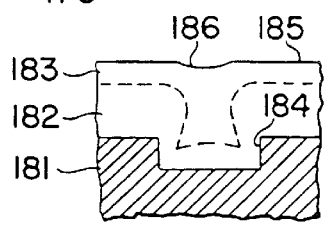
FIGS. 18 and 19 are cross-sections of the surface topology of an integrated circuit, in the manner of FIG. 16, illustrating the conformal, planar qualities of oxide films resulting from the application of our planarization process.
Figure 19:
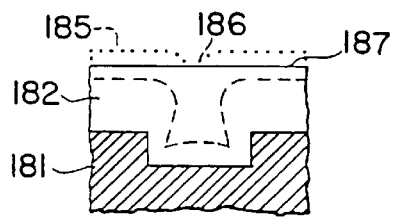

The use of the above-described three-step planarization process is shown schematically in FIGS. 18 and 19. As depicted in FIG. 18, the first step forms a relatively thick stepped layer 182 of silicon dioxide over the stepped topography 181 at a very high deposition rate. The second step is then used to form thereon conformal silicon dioxide layer 183, which is substantially planarized despite the underlying deep step 184. Finally, as shown in FIG. 19, the third, isotropic etch step quickly etches away the upper surface 185 to below the residual step topography 186, if any, in layer 183, thereby providing a smooth planar surface 187 for subsequent layers.

In addition, while the above-described three-step in-situ process is a presently preferred embodiment of our planarization process for silicon dioxide, the ozone- and TEOS-based thermal CVD step (second step) can be used in combination with other initial dielectric coatings and other isotropic etch steps. For example, the ozone thermal CVD second step can be used to deposit a highly conformal silicon dioxide coating on silicon oxide or silicon nitride or silicon oxynitride or other dielectric layers formed by CVD or by other methods, and the resulting substantially planarized layer can be etched to a planar topography using other, preferably high rate, dry (e.g., plasma) or wet chemical isotropic etch methods.

E. Chamber Self-Cleaning

An isotropic chamber self-cleaning etch sequence has been done using fluorinated gas at a pressure of about 600 mT to 10 torr, high RF power density of 1–2 watts/cm$^2$, distance, d, ≈1 cm and the other parameters, including the gas flow rates, described above for the isotropic etch process. This process has been used to clean the referenced multi-step CVD/PECVD reactor. After depositing an ~5$\mu$ thick silicon dioxide film on a wafer, the chamber can be cleaned in about one minute.

F. Summary; Alternative Process Sequences

The following is a partial listing of some of the possible ways in which the above-described deposition, etch and self-cleaning steps can be used, alone and in combination.

First, the thermal CVD conformal-oxide deposition process using ozone, oxygen and TEOS can be used alone to planarize an existing dielectric which has been formed, for example, without perfect step coverage or with perfect step coverage on a non-perfect topography.

Secondly, the conformal oxide-forming thermal CVD step can be applied to existing dielectrics followed by an isotropic etch step to etch back any remaining non-planarities to a planar topography.

Third, in a preferred high rate planar-dielectric forming sequence which can be used by itself to form dielectrics such as inter-level dielectrics or can be applied to rectify imperfect step coverage and/or topography in existing dielectrics, the above-described high rate PECVD oxide step is applied followed by the conformal oxide-forming thermal CVD sequence. In a preferred sequence using isotropic etch back to remove any non-planar features, the high rate PECVD oxide deposition sequence is utilized followed by the conformal oxide-forming thermal CVD step followed by an isotropic etch step, preferably the above-described high rate plasma isotropic etch.

Numerous other combinations are possible for particular situations/problems. For example, the following sequence may be preferred where it is desired to form a thin protective oxide layer over a sensitive device or other structure before the application of RF power:

1. Thermal $O_3$ CVD Conformal-Oxide Deposition;
2. High Rate PECVD Oxide Deposition;
3. Thermal $O_3$ CVD Conformal-Oxide Deposition;
4. PECVD Oxide Deposition; and
5. High Rate Isotropic Etch.

Also, for forming very thick planar oxides over stepped topographies, the first two steps of the following sequence can be used to planarize the stepped topography followed by application of the high rate oxide deposition to build up the very thick oxide thickness over the planar surface:

1. High Rate PECVD Oxide Deposition;
2. Thermal $O_3$ CVD Conformal Oxide Deposition; and
3. High Rate PECVD Oxide Deposition.

As another alternative, the very thick planar oxide process described immediately above can incorporate an isotropic etch back as the final step to achieve full planarization, and the required thickness.

Finally, but certainly not exhaustively, the isotropic chamber self-cleaning etch can be inserted as desired within or at the end of the other process sequences to maintain the chamber in a clean deposition-free state.

While this invention has been described above in connection with various preferred and alternative embodiments, it is understood that persons of skill in the art can make numerous modifications without departing from the scope of the invention as claimed in the following claims.

What is claimed is:

1. A method of protecting against deposition on a back surface and an edge of a substrate during processing of said substrate in a semiconductor processing chamber, said method comprising:

supporting the substrate in said processing chamber on a substrate support that is in thermal contact with said substrate flowing a process gas into a processing chamber; and flowing a purge gas to a periphery of said substrate to exclude said process gas from contacting said periphery of said substrate.

2. The method of claim 1 wherein said process gas comprises a product gas and a reactant gas.

3. The method of claim 1 wherein said process gas further comprises a carrier gas.

4. The method of claim 1 wherein said purge gas is an inert gas.

5. The method of claim 1 wherein said process gas is flowed at a rate of between 200 sccm to 15 slm.

6. The method of claim 5 wherein said purge gas is flowed at a rate of between 1 and 15 slm.

7. The method of claim 1 wherein said purge gas is flowed toward said periphery of said substrate through an annular groove.

8. The method of claim 7 wherein said purge gas is flowed toward said periphery of said substrate through said annular groove from a plurality of radial grooves.

9. The method of claim 1 further comprising removing said process gas and said purge gas through an exhaust system of said processing chamber.

10. The method of claim 1 wherein said purge gas is flowed across a peripheral region of a back surface of said substrate and across an edge of said substrate to prevent said process gas from contacting said peripheral region of said back surface of said substrate.

11. The method of claim 1 wherein said purge gas is flowed from a gas disperser positioned in a surface that is not in mechanical contact with the substrate.

12. The method of claim 5 wherein said purge gas is flowed from a gas disperser positioned in a surface that is not in mechanical contact with the substrate.

13. A method of protecting against deposition on a back surface and an edge of a substrate during processing of said substrate in a semiconductor processing chamber, said method comprising:

supporting said substrate in said processing chamber on a substrate support that is in thermal contact with said substrate;

introducing a process gas toward a front surface of said substrate to deposit a layer of material on said substrate, said process gas comprising a first reactant gas, a second reactant gas and a carrier gas;

introducing a purge gas around a backside periphery of said substrate such that said purge gas flows across said edge of said substrate and inhibits deposition of said material on said edge and back surface of said substrate, said purge gas comprising a nonreactive gas; and establishing a flow of said process and purge gases such that said process gas flows radially across said substrate, said purge gas combines with said process gas near said edge of said substrate, and said process and purge gases exits said processing chamber through an exhaust system.

14. The method of claim 13 wherein said first reactant gas comprises vaporized TEOS and said second reactant gas comprises oxygen.

15. The method of claim 13 wherein said first reactant gas comprises vaporized TEOS and said second reactant gas comprises ozone in oxygen.

16. The method of claim 13 further comprising the act of introducing a second purge gas to an edge of said substrate from a position above said front surface of said substrate.

17. The method of claim 13 wherein said purge gas is flowed from a gas disperser positioned in a surface that is not in mechanical contact with the substrate.

18. A method of substantially confining deposition of a layer of material on a semiconductor substrate to a front surface of said substrate, said method comprising:

supporting said substrate in a processing chamber on a substrate support that is in thermal contact with said substrate;

introducing a process gas toward said front surface of said substrate to deposit a film of said material on said front surface of said substrate, said process gas comprising a first reactant gas, a second reactant gas and a carrier gas;

introducing a purge gas around a backside periphery of said substrate such that said purge gas flows across said backside periphery of said substrate, said purge gas comprising a nonreactive gas; and establishing a flow of said process and purge gases such that said process gas flows radially across said front surface of said substrate, said purge gas combines with said process gas near an edge of said substrate, and said process and purge gases exits said processing chamber through an exhaust system.

19. The method of claim 18, wherein said purge gas is introduced toward said substrate such that said purge gas flows across an edge of said substrate.

20. The method of claim 19, wherein said purge gas is introduced toward said substrate such that said purge gas flows radially across a peripheral region of said back surface of said substrate and across said edge of said substrate.

21. A method of diminishing deposition on a back surface and an edge of a substrate during processing of said substrate in a semiconductor processing chamber having a gas manifold and an exhaust port, said method comprising:

supporting said substrate in said processing chamber on a substrate support that transfers heat to said substrate;

positioning a front surface of said substrate opposite said manifold;

flowing a process gas through said manifold to deposit a layer of material on said substrate; and flowing a purge gas from an annular groove toward said substrate and across said edge of said substrate to inhibit deposition of said material on said edge of said substrate, said purge gas comprising a nonreactive gas.

22. The method of claim 21 further comprising establishing a flow of said process and purge gases such that said process gas flows radially across said substrate, wherein unreacted gases from said process gas combine with said purge gas near said edge of said substrate, and said combined unreacted gases and purge gas exit said processing chamber through said exhaust port.

23. The method of claim 21 wherein said purge gas is introduced toward a peripheral region of said back surface such that it flows across said back surface peripheral region and across said edge of said substrate to prevent deposition of said material on said back surface and said edge of said substrate.

24. The method of claim 21 wherein said process gas comprises a first reactant gas, a second reactant gas, and a carrier gas.

25. The method of claim 24 wherein said first reactant gas and said second reactant gas react to deposit said material on said substrate at a rate of between about 500–4000 Angstroms per minute.

26. The method of claim 21 wherein said purge gas is introduced through said annular groove from a plurality of radial grooves.

27. The method of claim 21, further comprising:
loading said substrate in said chamber with a moveable wafer support mechanism;
transferring said substrate from said moveable wafer support mechanism to said substrate support; and
transferring said substrate from said substrate support to said moveable wafer support mechanism after deposition is completed.

28. The method of claim 21 wherein said purge gas is flowed from a gas disperser positioned in a surface that is not in mechanical contact with the substrate.

29. The method of claim 21 further comprising:

setting and maintaining a processing chamber pressure of between 10–200 torr; and heating said substrate to a temperature of between 200°–500° C.

30. A method of diminishing deposition on a back surface and an edge of a substrate during processing of said substrate in a semiconductor processing chamber having a gas manifold and an exhaust port, said method comprising the steps of:

setting and maintaining a processing chamber pressure of between 10–200 torr;

supporting said substrate in said processing chamber on a substrate support that transfers heat to said substrate;

heating said substrate to a temperature of between 200°–500° C.;

positioning a front surface of said substrate at a distance of less than about 0.2 inches from said manifold;

introducing a process gas through said manifold to deposit a layer of material on said substrate;

introducing a purge gas from an annular groove toward said substrate such that said purge gas flows across said edge of said substrate and prevents deposition of said material on said edge of said substrate, said purge gas comprising a nonreactive gas; and introducing a second purge gas from said gas manifold toward an upper surface of said edge of said substrate.

31. A method of minimizing deposition on a back surface and an edge of a substrate during processing of said substrate in a semiconductor processing chamber having a gas manifold and an exhaust port, said method comprising:

supporting said substrate in said processing chamber on a substrate support that transfers heat to said substrate;

positioning said manifold at a distance of less than about 0.2 inches toward a front surface of said substrate;

flowing a process gas through said manifold to deposit a layer of material on said substrate; and flowing a purge gas from an annular groove across said edge of said substrate to minimize deposition of said material on said edge of said substrate, said purge gas comprising a nonreactive gas.

32. The method of claim 31, further comprising:
loading said substrate in said chamber with a moveable wafer support mechanism;
transferring said substrate from said moveable wafer support mechanism to said substrate support; and
transferring said substrate from said substrate support to said moveable wafer support mechanism after deposition is completed.

33. The method of claim 31 further comprising establishing a flow of said process and purge gases such that said process gas flows radially across said substrate, wherein undeposited gases from said process gas combine with said purge gas near said edge of said substrate, and said combined undeposited gases and purge gas exit said processing chamber through said exhaust port.

34. The method of claim 31 wherein said purge gas is introduced from said annular channel across said back surface and said edge of said substrate such that said purge gas flows across said back surface and said edge of said substrate and minimizes deposition of said material on said back surface and said edge of said substrate.

35. The method of claim 31 wherein said process gas comprises a first reactant gas, a second reactant gas, and a carrier gas.

36. The method of claim 35 wherein said first reactant gas comprises vaporized TEOS and said second reactant gas comprises oxygen.

37. The method of claim 35 wherein said first reactant gas comprises vaporized TEOS and said second reactant gas comprises ozone in oxygen.

38. The method of claim 31 wherein said purge gas is introduced through said annular groove from a plurality of radial grooves.

39. The method of claim 35 wherein said first reactant gas and second reactant gas react to deposit said layer over said substrate as a rate between about 500 and 4000 Angstroms per minute.

40. The method of claim 31 wherein said purge gas is flowed from a gas disperser positioned in a surface that is not in mechanical contact with the substrate.

41. The method of claim 31 further comprising:

setting and maintaining a processing chamber pressure of between 1–50 torr; and heating said substrate to a temperature of between 200°–500° C.

42. A method of protecting against deposition on a back surface and an edge of a substrate during processing of said substrate in a semiconductor processing chamber, said method comprising the steps of:

supporting said substrate in said processing chamber on a susceptor;

introducing a process gas toward a front surface of said substrate to deposit a layer of material on said substrate, said process gas comprising a first reactant gas, a second reactant gas and a carrier gas;

introducing a first purge gas below said substrate such that said purge gas flows toward said back surface and said edge of said substrate;

introducing a second purge gas from above said substrate directed toward said edge of said substrate; and establishing a gas flow of said process and purge gases such that said process gas flows radially across said substrate, combines with said purge gases near said edge of said substrate, and exits said processing chamber through an exhaust system outside a circumference of said substrate.

43. A method of protecting against deposition on a back surface and an edge of a substrate during processing of said substrate in a semiconductor processing chamber, said method comprising:

supporting said substrate in a deposition zone of said processing chamber on a substrate support that is in thermal contact with said substrate;

flowing a process gas into said deposition zone so that said process gas flows radially across a front surface of said substrate to deposit a thin film layer on said substrate, said process gas comprising a first reactant gas, a second reactant gas and a carrier gas; and flowing a purge gas around a backside periphery of said substrate such that said purge gas flows radially across said edge of said substrate to inhibit deposition of said thin film layer on said edge and back surface of said substrate, said purge gas comprising a nonreactive gas.

44. The method of claim 43 wherein said purge gas is flowed from a gas disperser positioned in a surface that is not in mechanical contact with the substrate.

45. The method of claim 43 wherein said process gas and purge gas flows combine near said edge of said substrate and exit said processing chamber through an exhaust system.

* * * * *